(12) United States Patent
Kunieda et al.

(10) Patent No.: US 9,431,347 B2
(45) Date of Patent: *Aug. 30, 2016

(54) WIRING BOARD AND METHOD FOR MANUFACTURING THE SAME

(71) Applicant: IBIDEN CO., LTD., Ogaki-shi (JP)

(72) Inventors: Masatoshi Kunieda, Ogaki (JP); Makoto Terui, Ogaki (JP); Asuka Il, Ogaki (JP); Yoshinori Shizuno, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 47 days.

This patent is subject to a terminal disclaimer.

(21) Appl. No.: 14/294,534

(22) Filed: Jun. 3, 2014

(65) Prior Publication Data

US 2014/0360759 A1 Dec. 11, 2014

(30) Foreign Application Priority Data

Jun. 5, 2013 (JP) .................................. 2013-118884

(51) Int. Cl.
*H05K 1/11* (2006.01)
*H01L 23/538* (2006.01)
(Continued)

(52) U.S. Cl.
CPC ....... *H01L 23/5381* (2013.01); *H01L 21/4846* (2013.01); *H01L 23/49816* (2013.01); *H01L 23/5383* (2013.01); *H01L 23/5384* (2013.01); *H01L 24/13* (2013.01); *H01L 24/16* (2013.01); *H01L 24/32* (2013.01); *H01L 24/73* (2013.01); *H01L 24/81* (2013.01); *H01L 25/0655* (2013.01); *H01L 25/18* (2013.01); *H01L 2224/131* (2013.01); *H01L 2224/16225* (2013.01); *H01L 2224/32225* (2013.01); *H01L 2224/73204* (2013.01); *H01L 2224/81192* (2013.01); *H01L 2924/12042* (2013.01);
(Continued)

(58) Field of Classification Search
None
See application file for complete search history.

(56) References Cited

U.S. PATENT DOCUMENTS

2005/0258548 A1* 11/2005 Ogawa ................... H01G 4/232
257/778
2006/0226527 A1* 10/2006 Hatano ............... H01L 23/5389
257/686

(Continued)

FOREIGN PATENT DOCUMENTS

WO WO 2007/129545 11/2007

OTHER PUBLICATIONS

U.S. Appl. No. 14/294,588, filed Jun. 3, 2014, Terui, et al.
(Continued)

*Primary Examiner* — Steven T Sawyer
(74) *Attorney, Agent, or Firm* — Oblon, McClelland, Maier & Neustadt, L.L.P.

(57) ABSTRACT

A wiring board includes a first insulation layer, first conductive patterns formed on the first insulation layer and including first mounting pads positioned to mount a semiconductor element, a wiring structure positioned in the first insulation layer and having a second insulation layer, second conductive patterns formed on the second insulation layer, and second mounting pads connected to the second conductive patterns, and third mounting pads formed on the first insulation layer above the second mounting pads and connected to the second mounting pads such that the third mounting pads are positioned to mount the semiconductor element and form a distance between adjacent first and third mounting pads which is greater than a distance between adjacent first mounting pads.

20 Claims, 17 Drawing Sheets

(51) Int. Cl.
  *H01L 21/48* (2006.01)
  *H01L 23/498* (2006.01)
  *H01L 23/00* (2006.01)
  *H01L 25/065* (2006.01)
  *H01L 25/18* (2006.01)

(52) U.S. Cl.
  CPC .............. *H01L 2924/1436* (2013.01); *H01L 2924/15192* (2013.01); *H01L 2924/15311* (2013.01)

(56) References Cited

U.S. PATENT DOCUMENTS

| | | | | |
|---|---|---|---|---|
| 2009/0244874 | A1* | 10/2009 | Mahajan | H01L 24/16 361/809 |
| 2010/0081236 | A1* | 4/2010 | Yang | H01L 23/147 438/119 |
| 2011/0110061 | A1* | 5/2011 | Leung | H05K 1/115 361/783 |
| 2013/0256000 | A1 | 10/2013 | Terui et al. | |
| 2013/0258625 | A1 | 10/2013 | Terui et al. | |
| 2014/0102768 | A1 | 4/2014 | Shizuno et al. | |
| 2014/0174807 | A1* | 6/2014 | Roy | H01L 25/0655 174/261 |
| 2014/0264791 | A1* | 9/2014 | Manusharow | H01L 25/0655 257/666 |
| 2014/0353827 | A1* | 12/2014 | Liu | H01L 24/33 257/751 |

OTHER PUBLICATIONS

U.S. Appl. No. 14/283,337, filed May 21, 2014, Kariya, et al.

* cited by examiner

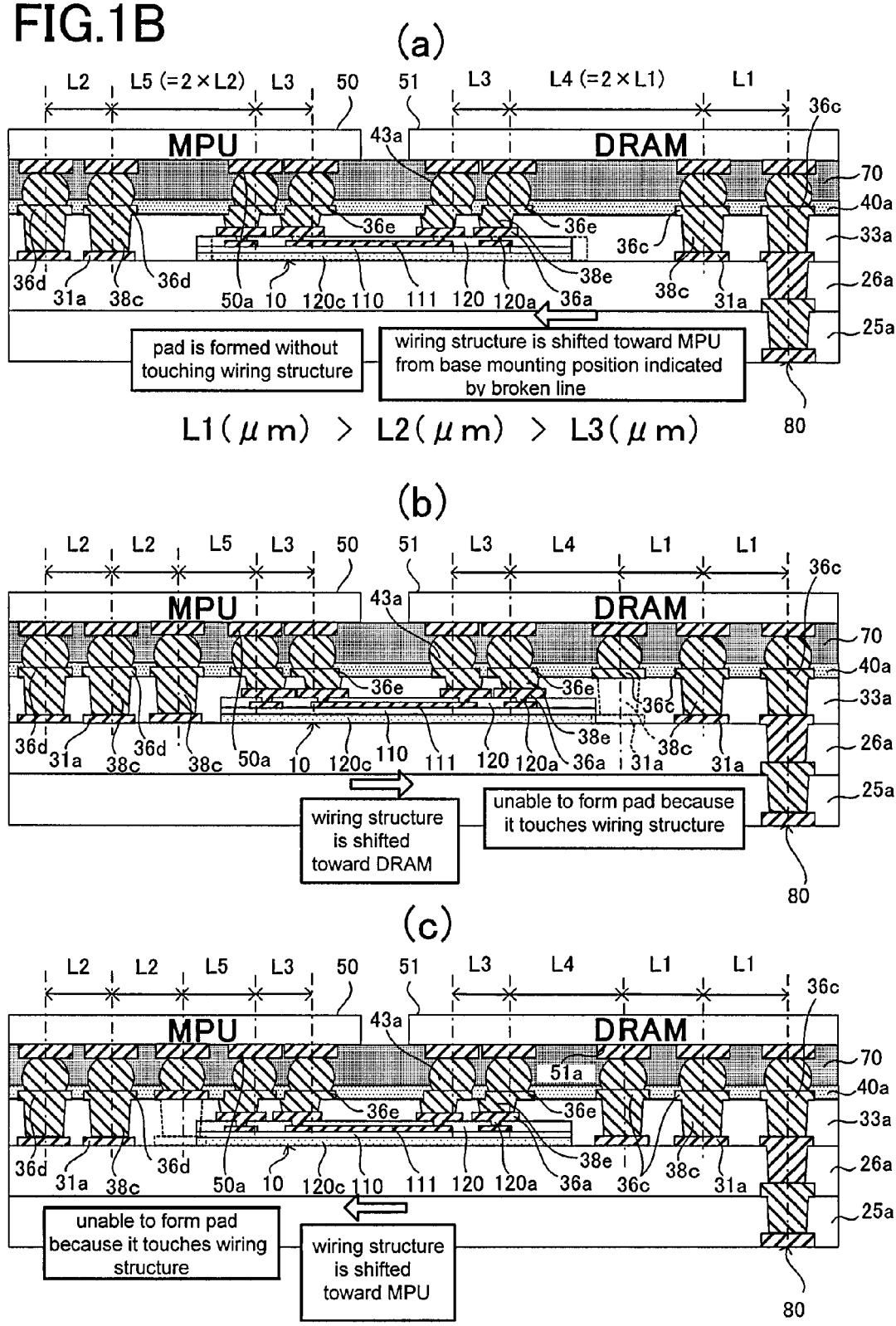

L1 ($\mu$m) > L2 ($\mu$m) > L3 ($\mu$m)

WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-118884, filed Jun. 5, 2013, the entire contents of which are incorporated herein by reference.

BACKGROUND OF THE INVENTION

1. Field of the Invention

The present invention relates to a wiring board and its manufacturing method, more specifically, to a wiring board that partially has high-density wiring and to a method for manufacturing such a wiring board.

2. Description of Background Art

In recent years, IC chips have become finer and more highly integrated, and the number of mounting pads formed on the uppermost layer of a package substrate is increased. The mounting pads increases are formed at a finer pitch. For example, Published International Application WO2007/129545 describes mounting pads and a package substrate. The entire contents of this publication are incorporated herein by reference.

SUMMARY OF THE INVENTION

According to one aspect of the present invention, a wiring board includes a first insulation layer, first conductive patterns formed on the first insulation layer and including first mounting pads positioned to mount a semiconductor element, a wiring structure positioned in the first insulation layer and having a second insulation layer, second conductive patterns formed on the second insulation layer, and second mounting pads connected to the second conductive patterns, and third mounting pads formed on the first insulation layer above the second mounting pads and connected to the second mounting pads such that the third mounting pads are positioned to mount the semiconductor element and form a distance between adjacent first and third mounting pads which is greater than a distance between adjacent first mounting pads.

According to another aspect of the present invention, a method for manufacturing a wiring board includes forming a wiring structure including a second insulation layer, second conductive patterns formed on the second insulation layer, and second mounting pads connected to the second conductive patterns, accommodating the wiring structure in a first insulation layer such that the wiring structure is positioned in the first insulation layer, forming on the first insulation layer first conductive patterns including first mounting pads such that the first mounting pads are positioned to mount a semiconductor element, and forming third mounting pads on the first insulation layer above the second mounting pads such that the third mounting pads are connected to the second mounting pads, positioned to mount the semiconductor element and form a distance between adjacent first and third mounting pads which is greater than a distance between adjacent first mounting pads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1B(a) is a cross-sectional view showing in detail a wiring board of the first embodiment;

FIG. 1B(b) is a cross-sectional view for reference where a wiring structure is shifted toward a DRAM;

FIG. 1B(c) is a cross-sectional view for reference where a wiring structure is shifted toward an MPU;

DETAILED DESCRIPTION OF THE EMBODIMENTS

Figure 1A:
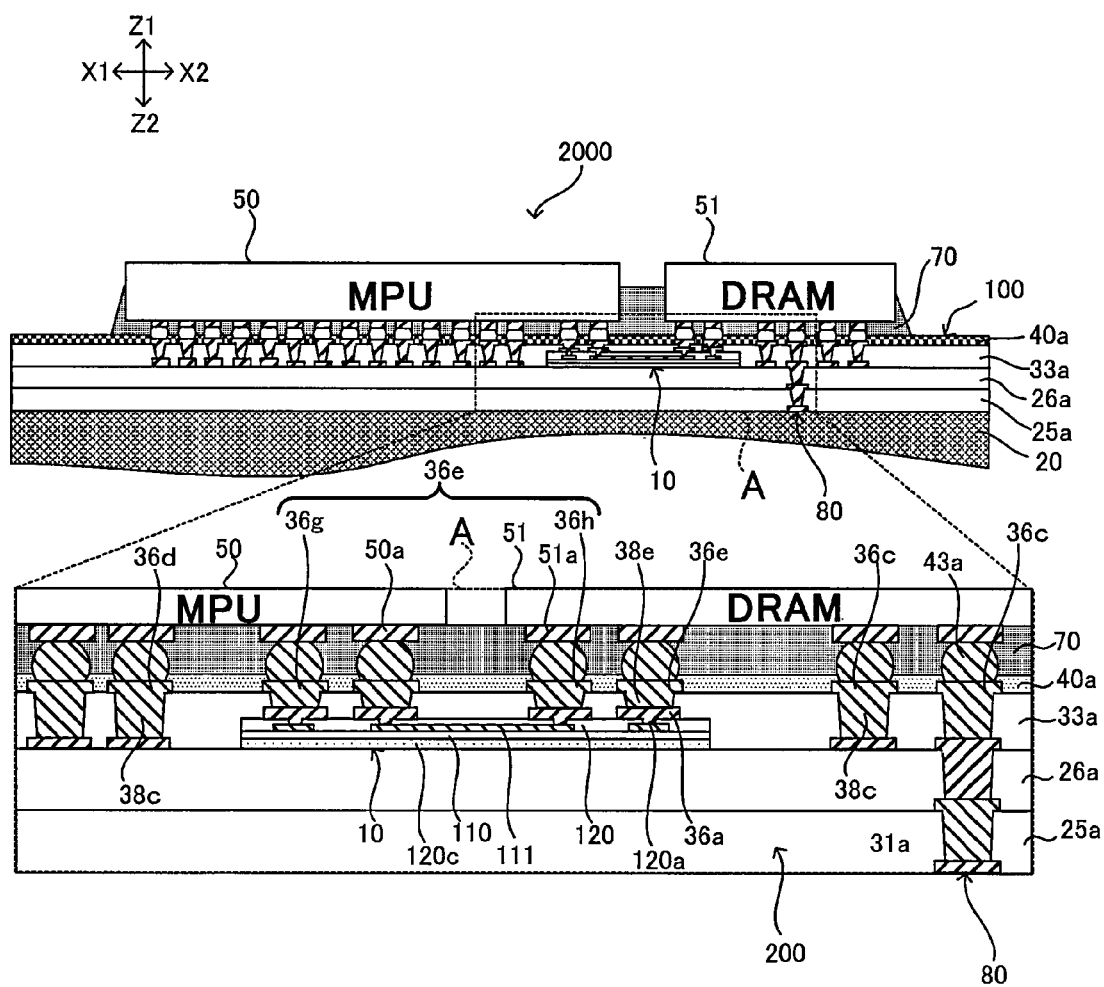
FIG. 1A is a cross-sectional view showing a package substrate where a wiring board according to a first embodiment of the present invention is used (the lower view shows an enlarged cross section of region "A," which is a part of the upper view)

The embodiments will now be described with reference to the accompanying drawings, wherein like reference numerals designate corresponding or identical elements throughout the various drawings.

In the drawings, arrows (Z1, Z2) each indicate a lamination direction in a wiring board (or a thickness direction of the wiring board) corresponding to a direction along a normal line to the main surfaces (upper and lower surfaces) of the wiring board. On the other hand, arrows (X1, X2) and (Y1, Y2) each indicate a direction perpendicular to a lamination direction (or a direction to a side of each layer). The main surfaces of the wiring board are on the X-Y plane. Side surfaces of the wiring board are on the X-Z plane or the Y-Z plane. In a lamination direction, a layer closer to the core of the wiring board is referred to as a lower layer, and a layer farther from the core is referred to as an upper layer.

In the following embodiments, conductive layers are formed to have one or multiple conductive patterns. A conductive layer may include a conductive pattern that forms an electrical circuit, such as wiring (including ground), a pad, a land or the like. Alternatively, a conductive layer may include a planar conductive pattern that does not form an electrical circuit.

Opening portions include a hole, a groove, a notch, a slit or the like.

Among the conductors formed in opening portions, the conductor formed in a via hole is referred to as a via conductor, the conductor formed in a through hole is referred to as a through-hole conductor, and the conductor filled in an opening portion is referred to as a filled conductor.

A land is the conductor formed on a hole (via hole, through hole or the like) or on the periphery of the hole. At least part of the land is formed to be contiguous to the conductor inside the hole (via conductor, through-hole conductor or the like).

"Being stacked" means that a via conductor is formed on the land of a via conductor formed in the lower layer. Namely, via conductors are stacked unless the bottom surface of a via conductor is off the land of its lower via conductor. Multiple vias stacked as above are referred to as stacked vias.

Plating includes dry plating such as PVD (Physical Vapor Deposition), CVD (Chemical Vapor Deposition) or the like, in addition to wet plating such as electrolytic plating, electroless plating or the like.

Interlayer insulation film (brand name: ABF-45SH, made by Ajinomoto), for example, is used for interlayer insulation layers and resin material used in a wiring structure.

Unless otherwise specified, the "width" (or thickness) of a hole or a column (protrusion) indicates the diameter if it is a circle, and $2\sqrt{}$ (cross-sectional area/$\pi$) if it is other than a circle. However, measurements are not limited to the above definitions if they are clearly indicated otherwise. Also, when the measurements are not uniform (roughened surface or tapering width, for example), basically, the average value of a measurement is used (average value of effective values excluding an abnormal value), unless it is clearly specified to use values other than the average value, for example, a maximum value.

First Embodiment

Wiring board 100 according to a first embodiment is a multilayer printed wiring board as shown in FIG. 1A, for example. Wiring board 100 of the present embodiment is a buildup laminated multilayer wiring board having a core substrate. However, a wiring board related to the present invention is not limited to a buildup laminated multilayer wiring board having a core substrate, and may be a double-sided rigid wiring board, flexible wiring board, or a flex-rigid wiring board, for example. Also, in wiring board 100, the measurements of conductive layers and insulation layers, the number of layers or the like may be modified freely within the scope of the technological concept of the present invention.

Figure 2:
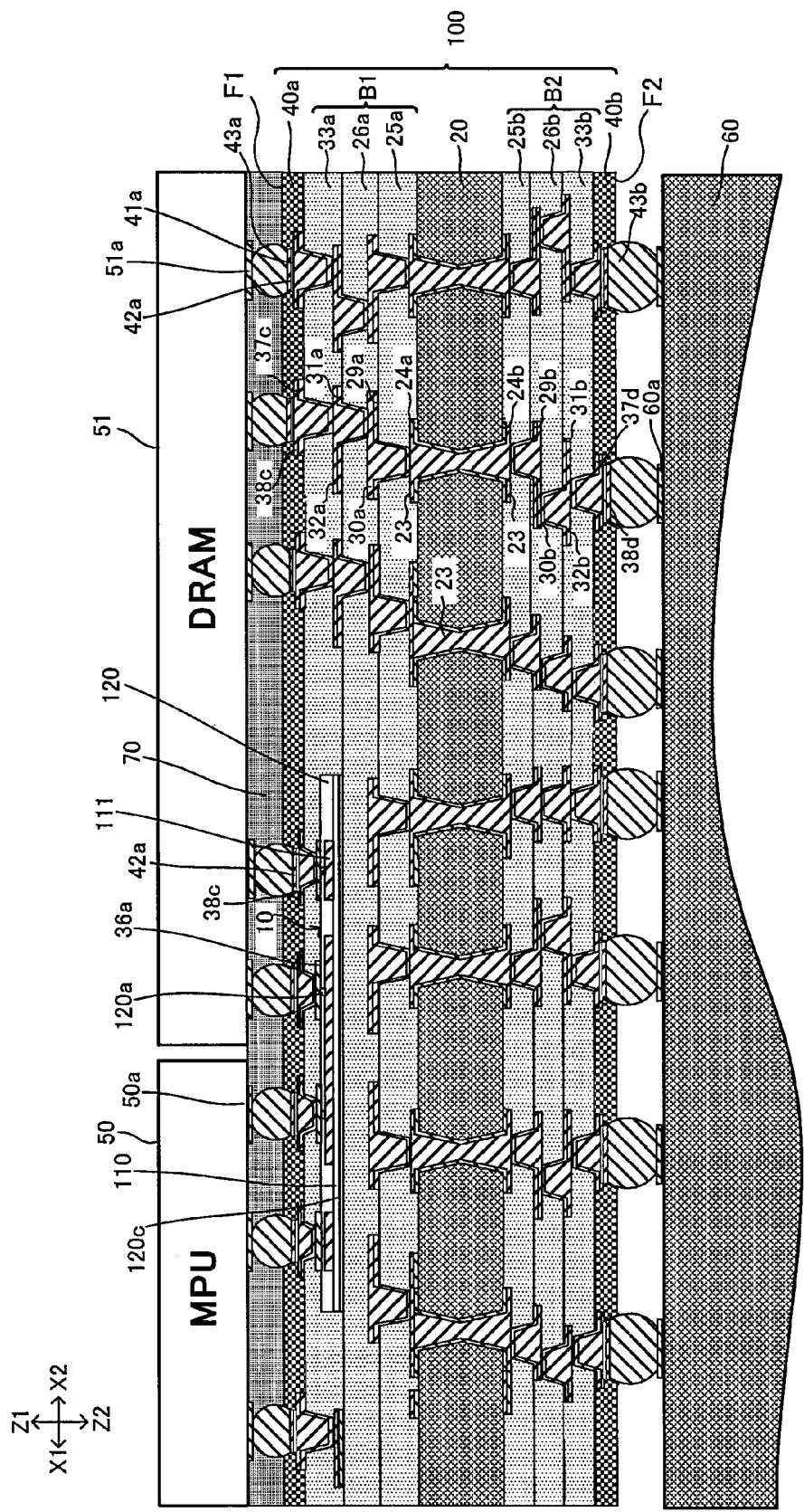
FIG. 2 is a cross-sectional view showing in detail a package substrate where the wiring board according to the first embodiment is used.

As shown in FIGS. 1A and 2, microprocessor MPU (Micro-Processing Unit) 50 as a first semiconductor element and dynamic RAM (dynamic random access memory) 51 as a second semiconductor element are mounted on wiring board 100 to form package substrate 2000. Wiring board 100 is mounted on motherboard 60 as shown in FIG. 2. Spaces among wiring board 100, MPU 50 and DRAM 51 are encapsulated with underfill resin 70.

As shown in FIG. 2, wiring board 100 has core substrate 20, interlayer insulation layers (25a, 26a, 33a, 25b, 26b, 33b), conductive layers (24a, 29a, 31a, 37c, 24b, 29b, 31b, 37d), via conductors (23, 30a, 32a, 38c, 30b, 32b, 38d), and solder-resist layers (40a, 40b) formed on the uppermost layers.

Core substrate 20 (wiring board 100) has first surface (F1) (Z1 side) and its opposing second surface (F2) (Z2 side), and via conductors 23 penetrate through core substrate 20. Core substrate 20, via conductors 23, and conductive layers (24a, 24b) correspond to the core section. In addition, buildup section (B1) (first laminated section) is formed on first surface (F1) of core substrate 20, and buildup section (B2) (second laminated section) is formed on second surface (F2) of core substrate 20. Buildup section (B1) includes three pairs of interlayer insulation layers and conductive layers (interlayer insulation layers (25a, 26a, 33a) and conductive layers (24a, 29a, 31a, 37c)), and buildup section (B2) includes three pairs of interlayer insulation layers and conductive layers (interlayer insulation layers (25b, 26b, 33b) and conductive layers (24b, 29b, 31b, 37d)). In addition, conductive layer (37c) includes conductive pads (36c, 36d, 36e).

On the first-surface (F1) side of core substrate 20, four conductive layers (24a, 29a, 31a, 37c) and three interlayer insulation layers (25a, 26a, 33a) are alternately laminated upward from below (Z2 side). Interlayer insulation layers (25a, 26a, 33a) are formed between their respective conductive layers (24a, 29a, 31a, 37c). Also, solder-resist layer (40a) is positioned on the surface of the first-surface (F1) side uppermost layer of core substrate 20.

On the second-surface (F2) side of core substrate 20, four conductive layers (24b, 29b, 31b, 37d) and three interlayer insulation layers (25b, 26b, 33b) are alternately laminated downward from above (Z1 side). Interlayer insulation layers (25b, 26b, 33b) are formed between their respective conductive layers (24b, 29b, 31b, 37d). Also, solder-resist layer (40b) is positioned on the surface of the second-surface (F2) side uppermost layer of core substrate 20.

Penetrating holes 21 (see FIG. 7B) which penetrate through core substrate 20 are formed in core substrate 20. Via conductors 23 are filled conductors, and are formed by filling a conductor in penetrating holes 21. Conductive layer (24a) on first surface (F1) of core substrate 20 and conductive layer (24b) on second surface (F2) of core substrate 20 are electrically connected by via conductors 23.

Core substrate 20 is made by impregnating core material with resin, for example. Core substrate 20 is obtained by, for example, impregnating fiberglass cloth with epoxy resin, thermosetting the resin, and molding the resin into a plate shape. However, that is not the only option, and any other material may be used for core substrate 20.

Via conductor 23 is formed to be a column in an hourglass shape with a diameter decreasing from first surface (F1) and second surface (F2) of core substrate 20 toward its center, for example. In addition, the planar shape of via conductor 23 (cross section on the X-Y plane) is a perfect circle, for example. However, those are not the only options, and via conductor 23 may be set in any other shape.

Via conductors (30a, 32a, 38c, 30b, 32b, 38d) are formed in their respective interlayer insulation layers (25a, 26a, 33a, 25b, 26b, 33b). Those via conductors are filled conductors, and are formed by filling a conductor in via holes that penetrate through their respective interlayer insulation layers. Via conductors (30a, 32a, 38c, 30b, 32b, 38d) are each a tapered column (truncated cone), tapering with a diameter decreasing toward core substrate 20. Their planar shapes (cross sections on the X-Y plane) are in a perfect circle, for example. However, those are not the only options, and via conductors (30a) and the like may be in any other shape.

Interlayer insulation layer (25a) (lowermost interlayer insulation layer of buildup section (B1)), interlayer insulation layer (25b) (lowermost interlayer insulation layer of buildup section (B2)), and their respective upper interlayer insulation layers (26a, 33a, 26b, 33b) are each made of interlayer insulation film (brand name: ABF-45SH, made by Ajinomoto). However, that is not the only option, and the material for each insulation layer may be selected freely.

Solder bumps (43a) are provided in the uppermost layer of wiring board 100. Solder bumps (43a) are electrically connected to MPU 50 and DRAM 51 through conductive pads (50a, 51a).

More specifically, conductive pad (36c) formed in conductive layer (37c) is connected to conductive pad (51a) of DRAM 51 through solder bump (43a), while conductive pad (36d) formed in conductive layer (37c) is connected to conductive pad (50a) of MPU 50 through solder bump (43a).

In the present embodiment, wiring board 100 includes main wiring board 200 and wiring structure 10 provided inside main wiring board 200. The wiring of wiring structure 10 is designed not according to wiring rules for multilayer printed wiring boards, but according to wiring rules for semiconductor elements such as ICs and LSIs as described later in detail. Compared with main wiring board 200, wiring structure 10 is designed to have a finer L/S (line and space), a ratio of line to space which is an index of wiring density. Here, the line indicates a pattern width, and a space indicates the gap between patterns, which is the distance between centers of pattern widths. In particular, wiring structure 10 is formed to have high wiring density so that the ratio of line to space, L/S (line and space), is 1 μm/1 μm to 5 μm/5 μm, preferably 3 μm/3 μm to 5 μm/5 μm. Such an L/S is a fine level, compared with the L/S of a regular multilayer printed wiring board, including main wiring board 200 of the present embodiment, which is usually set at approximately 10 μm/10 μm.

Figure 1C:
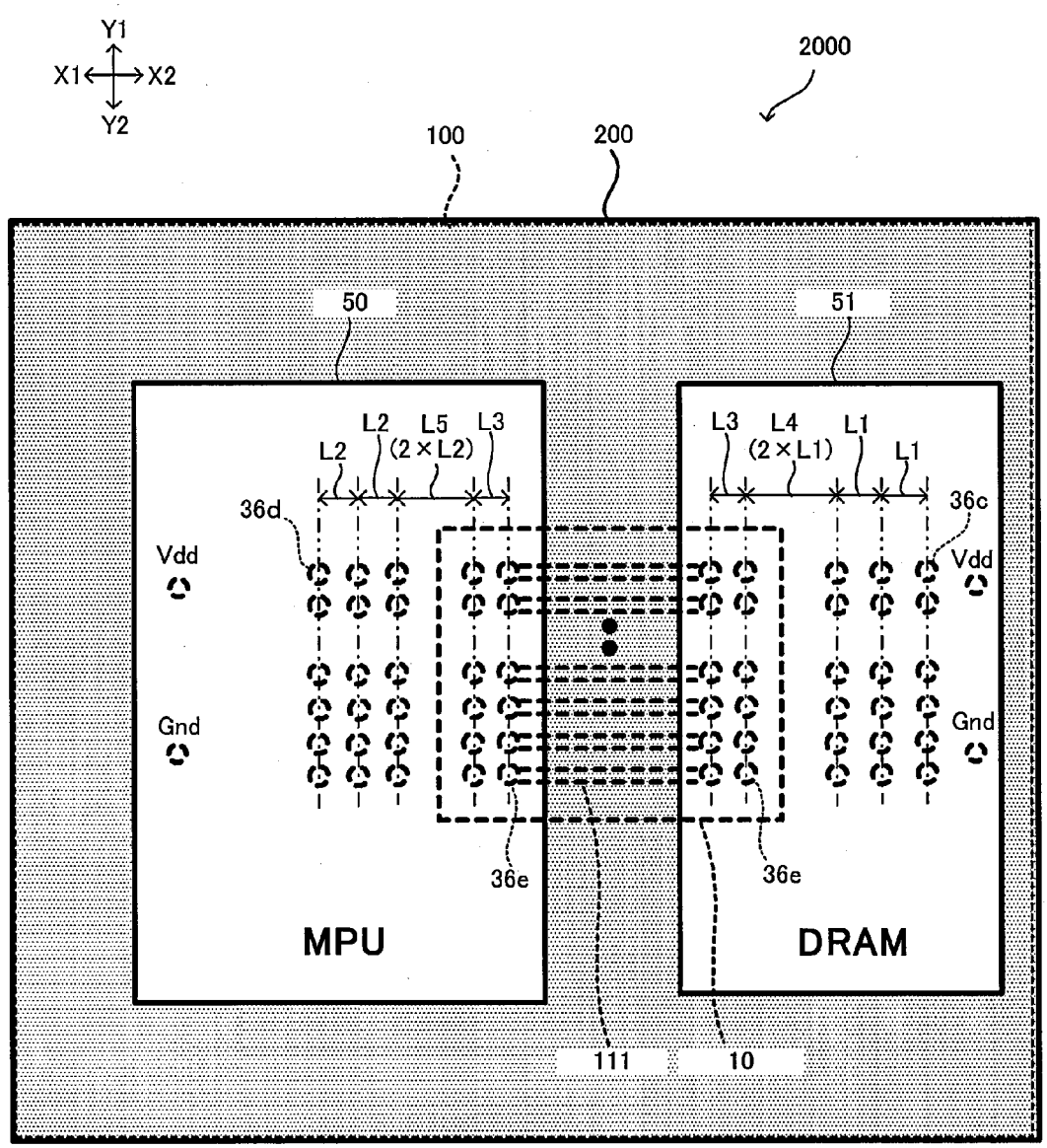
FIG. 1C is a plan view of FIG. 1(B) (a) seen from the Z2 side.

Main wiring board 200 includes signal transmission lines and power-supply lines to power-source terminals (Vdd) of semiconductor elements, MPU 50 and DRAM 51 (see FIGS. 1A and 1C).

Figure 3:
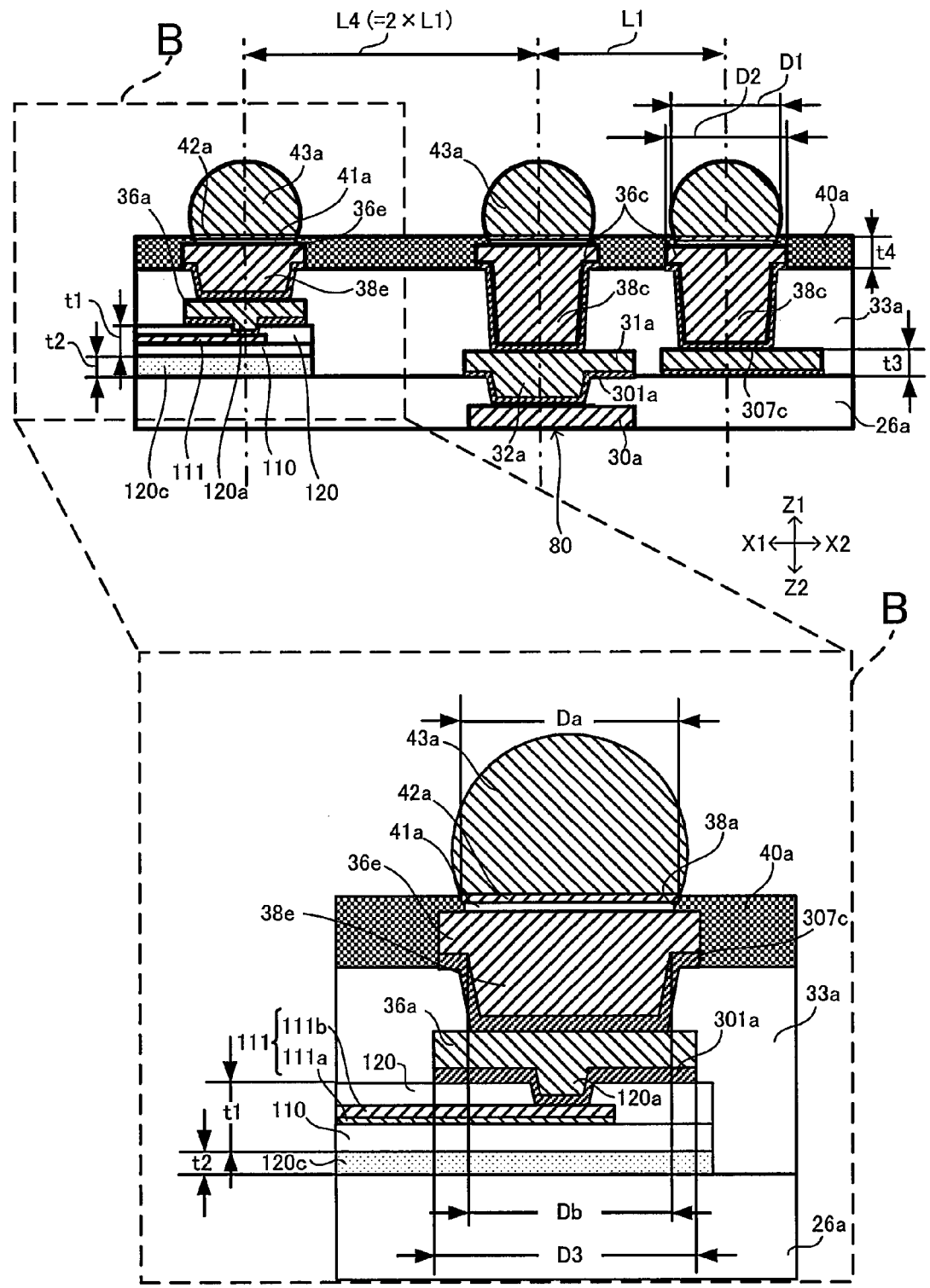
FIG. 3 is an enlarged view of a portion of the wiring board according to the first embodiment (the lower view shows an enlarged cross section of region "B," which is a part of the upper view)

Wiring structure 10 includes lowermost adhesive layer (120c), insulation layer 110 on adhesive layer (120c), insulation layer 120 on insulation layer 110, and conductive patterns 111 for signal transmission formed in insulation layer 120. Conductive patterns 111 are made of first conductive film (111a) and second conductive film (111b) as shown in FIG. 3. For insulation layers (110, 120), polyimide, phenolic resin or polybenzoxazole resin may be used as insulative material. Wiring structure 10 is positioned in interlayer insulation layer (33a). In addition, conductive pads (36a) for connection with conductive pads (50a) of MPU 50 and conductive pads (51a) of DRAM 51 (see FIG. 1A) are formed on wiring structure 10. Also, the pattern width of conductive patterns 111 in wiring structure 10 is smaller than the pattern widths of conductive layers (37c, 31a, 29a, 24a) of main wiring board 200.

As the material for adhesive layer (120c), an epoxy-resin-based, an acrylic-resin-based or a silicone-resin-based adhesive agent or the like may be used, for example. Small-diameter holes are formed in insulation layer 120. By filling conductor in those holes, via conductors (120a) are formed as filled vias.

Wiring structure 10 does not include a power-supply line, but includes only signal-transmission lines, and is used for transmitting signals between MPU 50 and DRAM 51.

More specifically, conductive patterns 111 are used for transmitting signals between MPU 50 and DRAM 51, but are not used for supplying power to MPU 50 and DRAM 51. Power terminals (Vdd) of MPU 50 and DRAM 51 are electrically connected to stacked vias 80 in main wiring board 200 (see FIGS. 1A and 3) so that power is directly supplied from an external DC power source. Ground terminals (Gnd) of MPU 50 and DRAM 51 (see FIG. 1C) are connected to ground through other stacked vias in main wiring board 200.

Via conductors (120a) are electrically connected to upper conductive pads (36a). Conductive pads (36a) are electrically connected to MPU 50 and DRAM 51 through upper via conductors (38e), solder bumps (43a) and conductive pads (50a, 51a). In wiring board 100 of the present embodiment, insulation layer 110 is disposed between conductive patterns 111 and adhesive layer (120c). Namely, wiring structure 10 is triple-layered. However, that is not the only option, and wiring structure 10 may be double-layered where insulation layer 110 is not disposed and conductive patterns 111 are formed directly on adhesive layer (120c). Also, referring to FIG. 1A, among conductive pads (36e) connected to conductive patterns 111 of wiring structure 10, the distance between conductive pads (36g) (first pads) connected to MPU 50 is shorter than the distance between conductive pads (36h) (second pads) connected to DRAM 51. In addition, the distance between adjacent conductive patterns 111 is shorter than the distance between adjacent conductive layers (conductive patterns) (31a).

Referring to FIG. 1B (a) and FIG. 1C, distance (L3) (μm) between conductive pads (36a) connected to conductive patterns 111 of wiring structure 10 is shorter than either of distance (L1) (μm) between conductive pads (36c) and distance (L2) (μm) between conductive pads (36d) formed respectively in conductive layer (37c) of wiring board 100. Also, as shown in FIG. 1B (a), distance (L4) (μm) between adjacent conductive pads (36c) and (36e) is longer than distance (L1) (μm) between conductive pads (36c). However, distance (L1) (μm) between conductive pads (36c) may be set equal to distance (L2) (μm) between conductive pads (36d). In addition, distance (L3) (μm) between conductive pads (36e) is shorter than either of distance (L1) between conductive pads (36c) and distance (L2) (μm) between conductive pads (36d).

Referring to FIG. 1A, conductive pads (36a) of wiring structure 10 are connected to conductive pads (36e) directly above wiring structure 10 through via conductors (38e) formed in interlayer insulation layer (33a). Also, conductive pads (36e) are connected to conductive pads (50a, 51a) of MPU 50 and DRAM 51 through solder bumps (43a). Thus, distance (L3) (μm) between conductive pads (36a) is equal to the distance between conductive pads (36e) directly on wiring structure 10.

The diameter of via conductors (120a) is preferred to be 1 μm or greater but 10 μm or less, more preferably 0.5 μm or greater but 5 μm or less. By setting the diameter of via conductors (120a) at such a microscopic size, the flexibility of wiring distribution at conductive patterns 111 is enhanced in wiring structure 10; for example, a greater number of wiring lines can be distributed from either a left or a right side of wiring structure 10 at conductive patterns 111 formed only in one insulation layer 120. In addition, since conductive patterns 111 are formed only in one layer, it contributes to reducing the number of wiring layers in wiring structure 10.

With metal layers (301a, 307c) made of metal foil, such as copper foil, electroless copper-plated film and electrolytic copper-plated film disposed in between, via conductors (32a, 38c) are provided in via holes formed respectively in interlayer insulation layers (26a, 33a) as shown in FIG. 3.

Among the measurements of via conductors shown in FIG. 3, diameter (D2) (width) on the top surface of via conductor (38c) is 62 μm, for example, and diameter (D1) of solder bump (43a) is 46 μm, for example. In addition, thickness (t1) of wiring structure 10 (except for adhesive layer (120c)) is 25 μm, for example, thickness (t2) of adhesive layer (120c) of wiring structure 10 is 10 μm, for example, thickness (t3) of conductive layer (31a) is 15 μm, for example, and thickness (t4) of solder-resist layer (40a) is 15 μm, for example. As described, by setting thickness (t2) of adhesive layer (120c) of wiring structure 10 to be approximately 10 μm, sufficient adhesive power with main wiring board 200 is obtained, expanding the flexibility for selecting the material to be used for adhesive layer (120c). Also, diameter (D3) of conductive pads (36a) on wiring structure 10 is 15 to 25 μm.

Solder bumps (43a) are positioned on conductive layer (37c) in opening portions (SRO) (38a) of solder-resist layers (40a, 40b) (see FIG. 2). Nickel-plated layer (41a) and gold-plated layer (42a) are formed between solder bump (43a) and conductive layer (37c) (see FIG. 3). In the present embodiment, diameter (Da) of opening portions (38a) of solder-resist layers (40a, 40b) is approximately 10% longer than diameter (Db) of opening portions of via conductors (38e) in uppermost layers. As described, when diameter (Da) of opening portions (38a) of solder-resist layers (40a, 40b) is greater than diameter (Db) of opening portions of via conductors (38e), the usual result is narrow tolerance during the manufacturing process. However, since the diameter of via conductors (120a) in wiring structure 10 is small, that is, 1 μm or greater but 10 μm or less, even if positional shifting occurs when wiring structure 10 is mounted on (adhered to) main wiring board 200, it has an advantage of a wider range to ensure electrical connection.

Referring to FIG. 1B (a) and FIG. 1C, distance (L4) (μm) between adjacent conductive pads (36c, 36e) is longer than distance (L1) (μm) between conductive pads (36c) in the present embodiment. More specifically, distance (L1) (μm) is set at 90 μm, and distance (L4) (μm) is set at 180 μm (=2×L1), twice as long as distance (L1) (μm).

Here, as shown in FIG. 1B (b), if distance (L4) (μm) between adjacent conductive pads (36c, 36e) is set to be equal to distance (L1) (μm) between conductive pads (36c), and if wiring structure 10 is shifted from the designated base mounting position toward DRAM 51 during the mounting process in wiring board 100, wiring structure 10 touches the conductive pad and via conductor (38c) formed on conductive layer (31a), which are closest to wiring structure 10. Thus, it is thought that conductive pad (36c) of wiring board 100 (on the package substrate side) may not be formed properly in a position corresponding to conductive pad (51a) of DRAM 51.

However, in the present embodiment, as shown in FIG. 1B (a), distance (L4) (μm) between adjacent conductive pads (36c, 36e) is set longer than distance (L1) (μm) between conductive pads (36c). Accordingly, the space for mounting wiring structure 10 can be set wider so as to include a potential amount of positional shifting. By so setting, even if wiring structure 10 is shifted toward DRAM 51 from the base mounting position during the mounting process in wiring board 100, wiring structure 10 is prevented from touching the conductive pad and via conductor (38c) formed on conductive layer (31a), which are closest to wiring structure 10. As a result, connection failure of conductive pads (51a) of DRAM 51 is reduced. Positions of conductive pads (51a) of DRAM 51 are customized (formed exclusively for the DRAM) to correspond to positions of conductive pads (36c) of the wiring board 100 (package substrate side).

Also, distance (L5) (μm) between adjacent conductive pads (36d, 36e) is longer than distance (L2) (μm) between conductive pads (36d). In particular, distance (L2) (μm) is set at 70 μm, and distance (L5) (μm) is set at 140 μm (=2×L2), twice the length of distance (L2) (μm).

Meanwhile as shown in FIG. 1B (c), if distance (L5) (μm) between adjacent conductive pads (36d, 36e) is set to be equal to distance (L2) (μm) between conductive pads (36d), and if wiring structure 10 is shifted from the base mounting position toward MPU 50 during the mounting process in wiring board 100, wiring structure 10 touches the conductive pad and via conductor (38c) formed on conductive layer (31a), which are closest to wiring structure 10. Thus, it is thought that conductive pad (36d) of wiring board 100 (on the package substrate side) may not be formed properly in a position corresponding to conductive pad (50a) of MPU 50.

However, in the present embodiment, as shown in FIG. 1B (a), distance (L5) (μm) between adjacent conductive pads (36d, 36a) is set longer than distance (L2) (μm) between conductive pads (36d). Accordingly, the space for mounting wiring structure 10 can be set wider so as to include a potential amount of positional shifting. By so setting, even if wiring structure 10 is shifted toward MPU 50 from the base mounting position indicated by a broken line during the mounting process in wiring board 100, wiring structure 10 is prevented from touching the conductive pad and via conductor (38c) formed on conductive layer (31a), which are closest to wiring structure 10 as shown in FIG. 1B (a). As a result, connection failure of conductive pads (50a) of MPU 50 is reduced. Positions of pads (50a) of MPU 50 are customized (formed exclusively for the MPU) to correspond to positions of conductive pads (36c) of the wiring board 100 (package substrate side).

Distance (L4) (μm) between adjacent conductive pads (36c, 36e) is set twice as long as distance (L1) (μm) between conductive pads (36c), but distance (L4) (μm) may be set n-times as long as distance (L1) (μm) ("n" is a whole number of 3 or greater). Also, distance (L5) (μm) between adjacent conductive pads (36d, 36e) is set twice as long as distance (L2) (μm) between conductive pads (36d), but distance (L5) (μm) may be set n-times as long as distance (L1) (μm) ("n" is a whole number of 3 or greater).

The present embodiment is set under such conditions that wiring structure 10 is provided in a designated position of wiring board 100 and that virtually no positional shifting exists between wiring structure 10 and wiring board 100. As described above, distances (L4, L5) (μm) between conductive pads (36c, 36d) and their respective adjacent conductive pads (36e) are set longer than either of distance (L1) (μm) between conductive pads (36c) and distance (L2) (μm) between conductive pads (36d). That is to enhance the mountability of wiring structure 10 by ensuring in wiring board 100a wider space for wiring structure 10 to include a potential amount of positional shifting. Accordingly, distance (L4) (μm) between adjacent conductive pads (36c, 36e) as well as distance (L5) (μm) between adjacent conductive pads (36d, 36e) may be set at any length as long as each distance is longer than either of distance (L1) between conductive pads (36c) (μm) and distance (L2) (μm) between conductive pads (36d) within a range that enhances the mountability of wiring structure 10.

In the present embodiment, wiring structure 10 is provided in a proper position of wiring board 100, and virtually no positional shifting occurs between wiring structure 10 and wiring board 100. Thus, MPU 50 and DRAM 51 are connected through the shortest route using wiring structure 10 having signal transmission wiring. Thus, ideal signal transmission is conducted between MPU 50 and DRAM 51.

A through hole that penetrates through all the layers of main wiring board 200 is not formed in wiring board 100 of the present embodiment. However, that is not the only option, and a through hole penetrating all the layers of main wiring board 200 may be formed to electrically connect conductive layers on uppermost layers to each other and to use for transmitting signals or supplying power to semiconductor elements on wiring board 100.

According to wiring board 100 of the present embodiment, main wiring board 200 has built-in wiring structure 10 which has a higher wiring density than main wiring board 200 and is used for transmitting signals between semiconductor elements. Accordingly, design flexibility of wiring board 100 as a multilayer printed wiring board is enhanced. For example, concentration of all the power-source wiring and signal wiring in a specific region of the wiring board is prevented. Also, a structure where only resin is provided without including any conductor can be avoided in a region which is near an electronic component where no electronic component is present.

A description is provided for an example of the method for manufacturing wiring board 100 according to the present embodiment. The process for manufacturing wiring board 100 is made up of the process for manufacturing wiring structure 10 and of the process for manufacturing main wiring board (multilayer printed wiring board) 200, which includes steps for mounting wiring structure 10 on main wiring board 200. Wiring structure 10 is manufactured by a process shown in FIG. 4, for example.

Process for Manufacturing Wiring Structure

Figure 4:
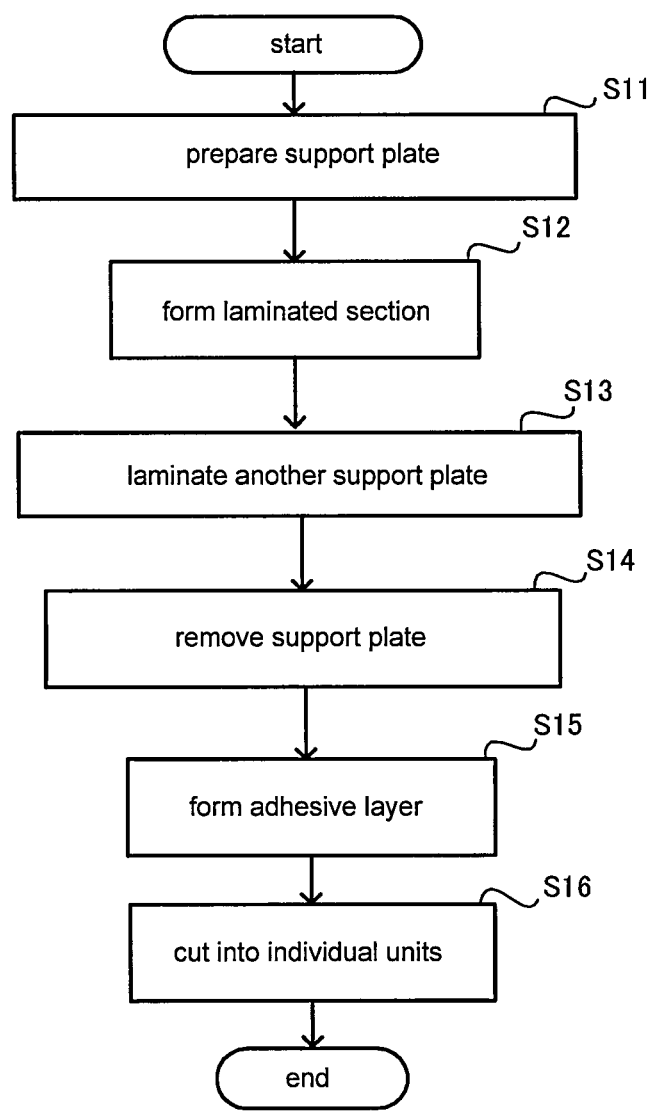
FIG. 4 is a flowchart showing a process for manufacturing a wiring structure according to the first embodiment.
Figure 5A:
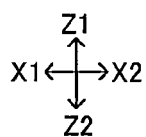
FIG. 5A is a view illustrating a step in a method for manufacturing a wiring structure shown in FIG. 4.
Figure 5A:

In step (S11) of FIG. 4, support plate 1001 is prepared as shown in FIG. 5A. Support plate 1001 is made of glass with a flat surface, for example. Then, release agent 1002 is applied on support plate 1001.

In step (S12) of FIG. 4, a laminated section is formed on support plate 1001 with release agent 1002 disposed in between. Such a laminated section is formed by alternately laminating a resin insulation layer and a conductive pattern (conductive layer).

Figure 5B:
FIG. 5B is a view illustrating a step in the method for manufacturing a wiring structure shown in FIG. 4.
Figure 5C:
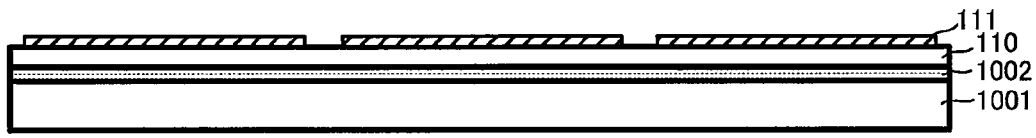
FIG. 5C is a view illustrating a step in the method for manufacturing a wiring structure shown in FIG. 4.

More specifically, insulation layer 110 (resin insulation layer) made of resin, for example, is positioned on release agent 1002 as shown in FIG. 5B. Heat is applied, for example, to adhere insulation layer 110 and release agent 1002.

Next, as shown in FIG. 5B, using a semi-additive (SAP) method, for example, conductive patterns 111 are formed on insulation layer 110. Conductive patterns 111 are made of first conductive film (111a) and second conductive film (111b) (see FIG. 3). More specifically, first conductive film (111a) is double-layered with a TiN layer (lower layer) and a Cu layer (upper layer). Such metal layers are formed by sputtering, for example, and excellent adhesiveness is achieved between fine conductive patterns 111 and the base material. Also, second conductive film (111b) is made of electroless copper-plated film on the Cu layer and electrolytic plated film on the electroless copper-plated film.

Conductive patterns 111 are formed to be high density, setting a ratio of line to space, L/S (line and space), at 1 μm/1 μm to 5 μm/5 μm, preferably 3 μm/3 μm to 5 μm/5 μm. Here, a line indicates a pattern width, and a space indicates the gap between patterns, which is the distance between centers of pattern widths. Wiring density here is formed according to wiring rules the same as those used when wiring is formed in semiconductor elements such as ICs (Integrated Circuits) and LSIs (Large-Scale Integrated Circuits).

Figure 5D:
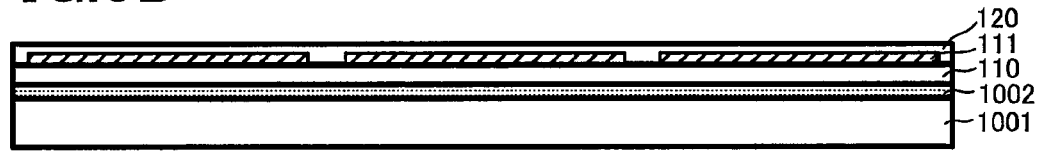
FIG. 5D is a view illustrating a step in the method for manufacturing a wiring structure shown in FIG. 4.

Next, as shown in FIG. 5D, insulation layer 120 is formed on insulation layer 110 by lamination or the like, for example. Insulation layer 120 is formed to cover conductive patterns 111.

Next, using a laser, for example, holes (via holes) are formed in insulation layer 120. Holes are formed to reach conductive patterns 111 to expose their portions. The diameter of holes is set to be 1 μm or greater and 10 μm or smaller, preferably 0.5 μm or greater and 5 μm or smaller, to form microscopic holes. Then, desmearing or soft etching is performed if needed.

Next, using a semi-additive (SAP) method or the like, for example, via conductors (120a) are formed in the holes (filled conductors) while conductive pads (conductive layer) (36a) are formed on insulation layer 120 to be connected to via conductors (120a).

Figure 5E:
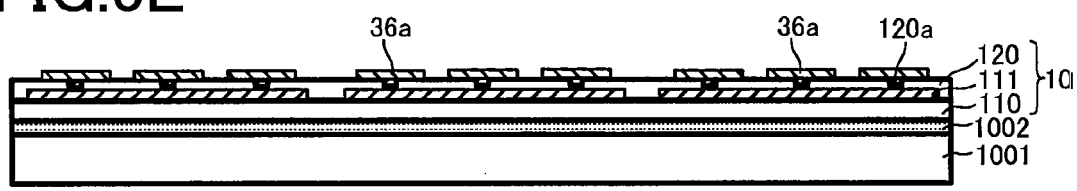
FIG. 5E is a view illustrating a step in the method for manufacturing a wiring structure shown in FIG. 4.

Accordingly, laminated section 101 having insulation layers (110, 120) and conductive patterns 111 is formed on support plate 1001 as shown in FIG. 5E. Also, via conductors (120*a*) and conductive pads (36*a*) are respectively formed in and on insulation layer 120 of laminated section 101.

Figure 5F:
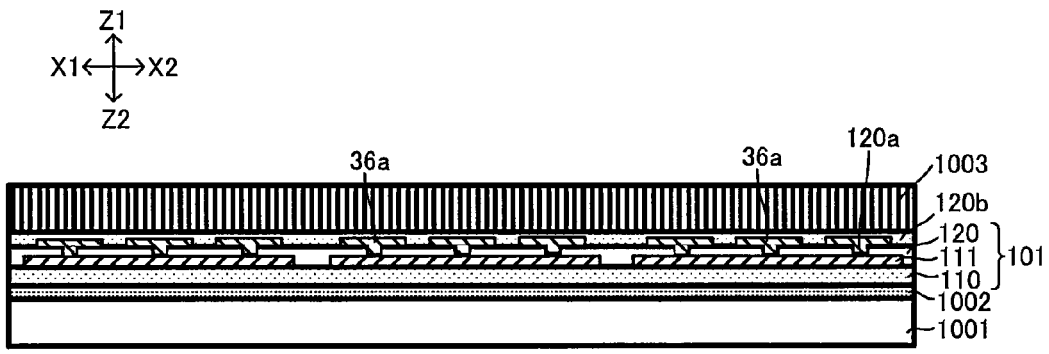
FIG. 5F is a view illustrating a step in the method for manufacturing a wiring structure shown in FIG. 4.

In step (S13) of FIG. 4, another support plate 1003 is prepared as shown in FIG. 5F. Support plate 1003 is made of glass with a flat surface, for example, the same as support plate 1001. Then, support plate 1003 is laminated on laminated section 101 with adhesive layer (120*b*) disposed in between.

Figure 5G:
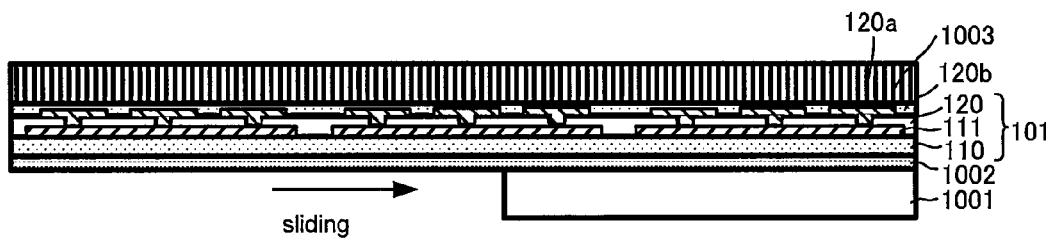
FIG. 5G is a view illustrating a step in the method for manufacturing a wiring structure shown in FIG. 4.
Figure 5H:
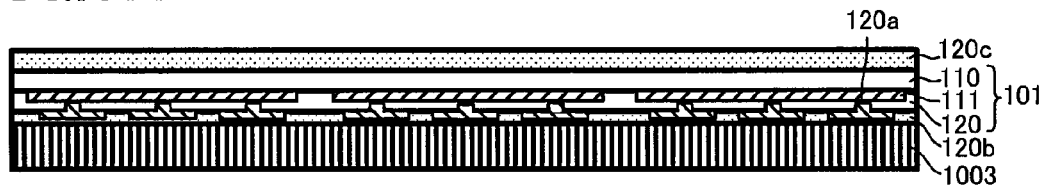
FIG. 5H is a view illustrating a step in the method for manufacturing a wiring structure shown in FIG. 4.

In step (S14) of FIG. 4, support plate 1001 is removed. More specifically, as shown in FIG. 5G, release agent 1002 is softened by applying heat, for example, and support plate 1001 is slid in a direction X (or a direction Y) so that support plate 1001 is removed from laminated section 101. Here, if release agent 1002 remains on the second main surface of laminated section 101 after support plate 1001 is removed from laminated section 101, cleansing is conducted to remove the residual release agent 1002. Accordingly, a substrate is obtained where laminated section 101 is formed on support plate 1003 as shown in FIG. 5H. Support plate 1001 is recyclable after being cleansed or the like. Instead of glass material, epoxy substrate or the like containing glass cloth may also be used for support plate 1001.

In step (S15) of FIG. 4, using an epoxy-resin-based, acrylic-resin-based or silicone-resin-based adhesive agent or the like, adhesive layer (120*c*) is formed on laminated section 101. More specifically, adhesive layer (120*c*) is formed, for example, by laminating an adhesive agent on laminated section 101 by a laminator so as to obtain a uniform thickness.

Figure 5I:
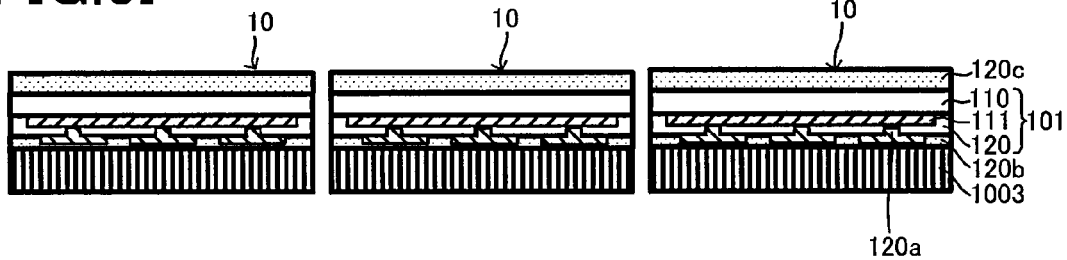
FIG. 5I is a view illustrating a step in the method for manufacturing a wiring structure shown in FIG. 4.

In step (S16) of FIG. 4, using a dicing saw, for example, wiring board 100 is cut along predetermined dicing lines to make individual units as shown in FIG. 5I. Accordingly, multiple wiring structures 10 are obtained. Wiring structure 10 obtained here is formed by forming laminated section 101 on support plate 1003 with adhesive layer (120*b*) disposed in between and by further forming adhesive layer (120*c*) on laminated section 101.

The method for manufacturing wiring structure 10 of the present embodiment is suitable for manufacturing wiring structure 10 since flat-surface glass plates are used for support plates (1001, 1003). According to such a manufacturing method, a high-quality wiring board 100 with flat surfaces is obtained where a degree of warping is suppressed.

Next, main wiring board 200 is manufactured while wiring structure 10 is mounted on main wiring board 200 so that wiring board 100 of the present embodiment is obtained. Wiring board 100 is manufactured by a process shown in FIG. 6, for example.

Process for Manufacturing Wiring Board

Figure 6:
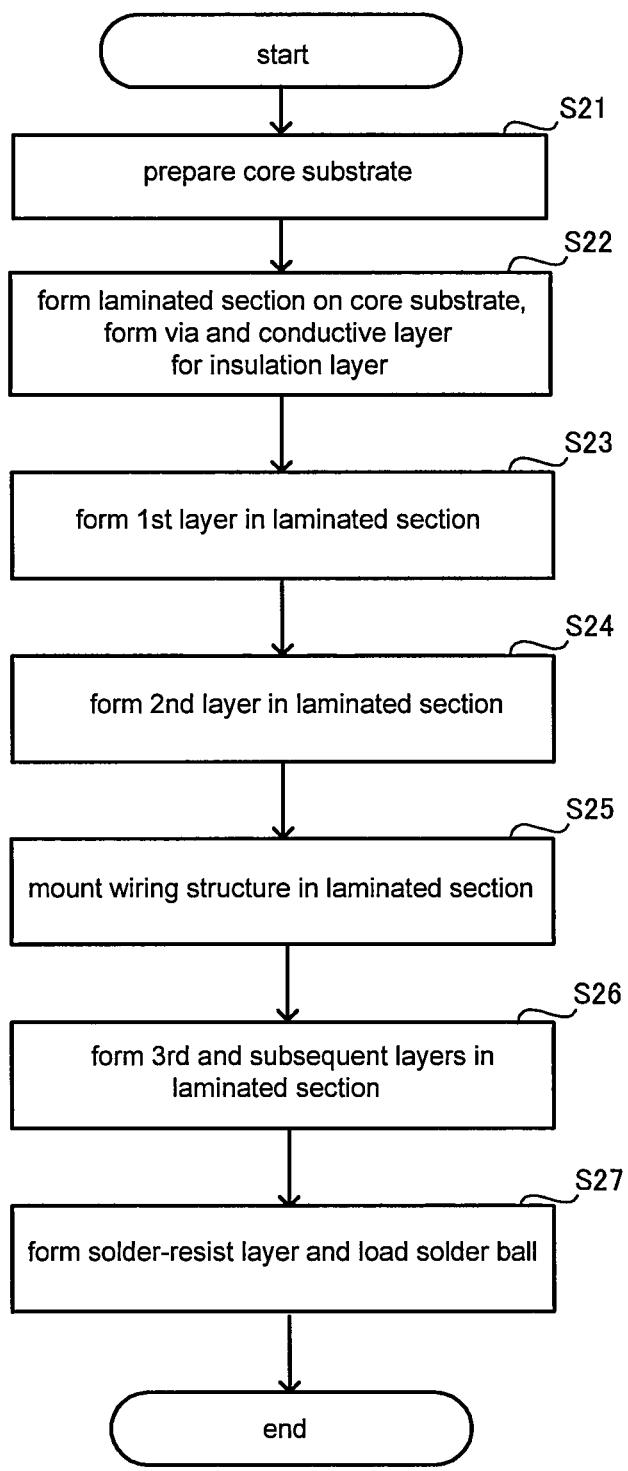
FIG. 6 is a flowchart showing a process for manufacturing a wiring board according to the first embodiment.
Figure 7A:
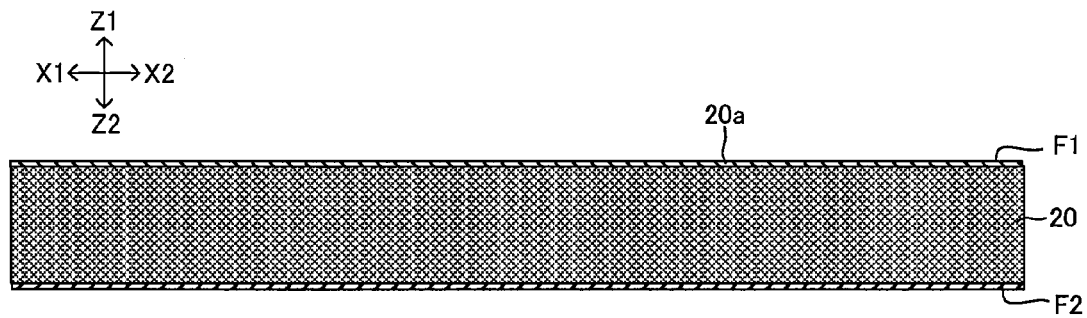
FIG. 7A is a view illustrating a step in a method for manufacturing a wiring board shown in FIG. 6.

First, in step (S21) of FIG. 6, core substrate 20 made of reinforcing material impregnated with resin is prepared as shown in FIG. 7A. On first surface (F1) and second surface (F2) of core substrate 20, copper foil (20*a*) is formed by lamination. The thickness of core substrate 20 is 0.4 to 0.7 mm, for example. Glass cloth, aramid fiber, fiberglass or the like, for example, may be used for the reinforcing material. Epoxy resin, BT (bismaleimide triazine) resin or the like, for example, may be used for the resin. In the resin, particles made of hydroxide are further contained. Examples of hydroxides are metal hydroxide such as aluminum hydroxide, magnesium hydroxide, calcium hydroxide and barium hydroxide. When heat is applied, hydroxides decompose and generate water. Thus, hydroxides are thought to be capable of robbing heat from the material of the core substrate. Namely, when the core substrate contains a hydroxide, processability by a laser is thought to improve.

Next, a solution containing NaOH (10 g/L), $NaClO_2$ (40 g/L) and $Na_3PO_4$ (6 g/L) is applied on the surface of copper foil (20*a*) to perform black-oxide treatment through a blackening bath (oxidation bath).

Figure 7B:
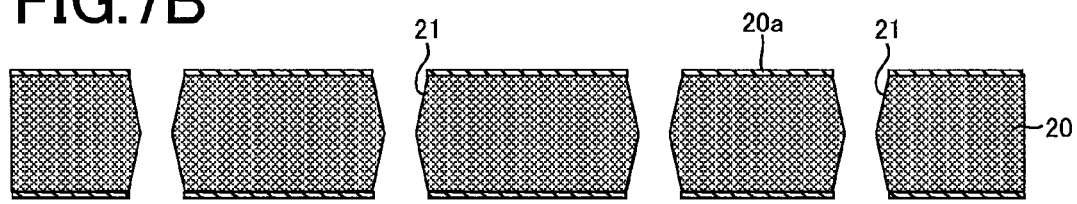
FIG. 7B is a view illustrating a step in the method for manufacturing a wiring board shown in FIG. 6.

In step (S22) of FIG. 6, laser light is irradiated using a $CO_2$ laser from the first-surface (F1) (upper-surface) side and the second-surface (F2) (lower-surface) side of core substrate 20 to form penetrating hole 21 which penetrates through core substrate 20 as shown in FIG. 7B. More specifically, using a $CO_2$ laser, by irradiating laser light alternately from the first-surface (F1) side and the second-surface (F2) side of core substrate 20, holes formed from the first-surface (F1) side and the second-surface (F2) side are connected to each other so that penetrating holes 21 are formed.

Desmearing is performed by immersing core substrate 20 in a solution containing permanganic acid at a predetermined concentration. At that time, the treatment is preferred to be performed in a way that the weight reduction of core substrate 20 is 1.0 wt. % or less, preferably 0.5 wt. % or less. Since core substrate 20 is made by impregnating resin into reinforcing material such as glass cloth, the glass cloth will protrude into a penetrating hole when the resin is dissolved through a desmearing treatment. If the degree of weight reduction of core substrate 20 is set as above, the degree of protrusion of glass cloth is suppressed, and voids are prevented from remaining when plating is filled in the penetrating hole. Then, a palladium catalyst is attached to surfaces of core substrate 20.

Figure 7C:
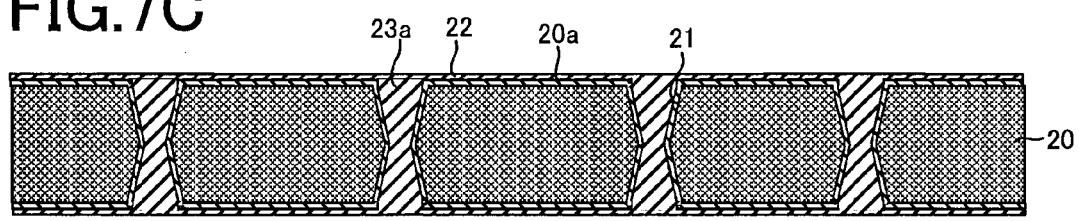
FIG. 7C is a view illustrating a step in the method for manufacturing a wiring board shown in FIG. 6.

As shown in FIG. 7C, core substrate 20 is immersed in an electroless plating solution to form electroless plated film 22 on first surface (F1) and second surface (F2) of core substrate 20 as well as on the inner walls of penetrating holes 21. Copper, nickel or the like may be used as the material for forming electroless plated film 22. Using electroless plated film 22 as a seed layer, electrolytic plated film (23*a*) is formed on electroless plated film 22. Penetrating holes 21 are filled with electrolytic plated film (23*a*).

Figure 7D:
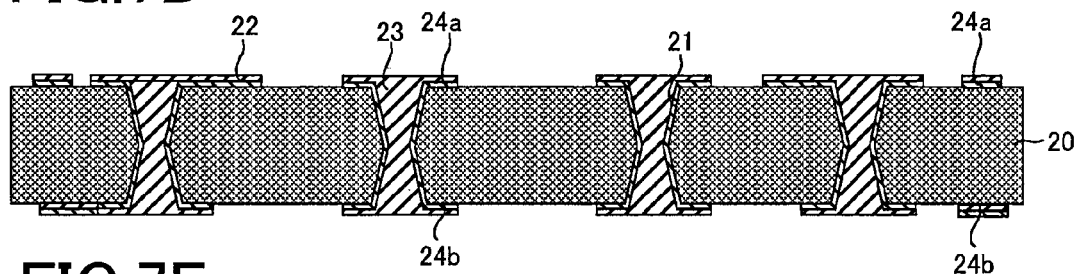
FIG. 7D is a view illustrating a step in the method for manufacturing a wiring board shown in FIG. 6.

As shown in FIG. 7D, etching resist with a predetermined pattern is formed on electrolytic plated film (23*a*) on substrate surfaces. Then, portions are removed from electroless plated film 22, electrolytic plated film (23*a*) and copper foil (20*a*) where no etching resist is formed. Then, by removing the etching resist, conductive layer (first conductor) (24*a*) is formed on first surface (F1) of core substrate 20 and conductive layer (second conductor) (24*b*) is formed on second surface (F2) of core substrate 20. Conductive layers (24*a*, 24*b*) are electrically connected to each other by via conductors 23 made of electrolytic plated film in penetrating holes 21.

Figure 7E:
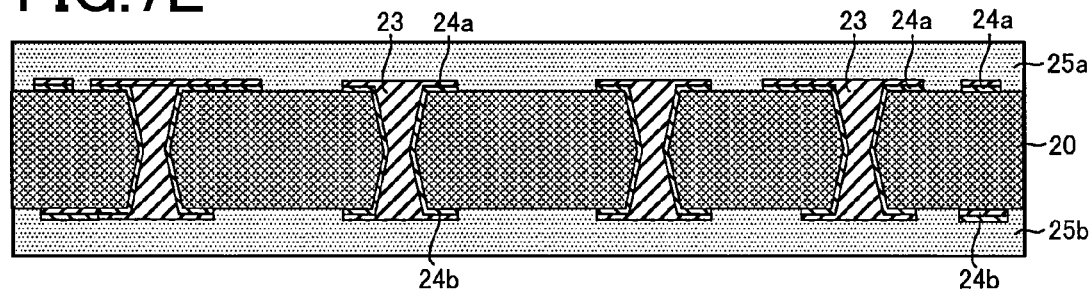
FIG. 7E is a view illustrating a step in the method for manufacturing a wiring board shown in FIG. 6.

In step (S23) of FIG. 6, interlayer insulation film (brand name: ABF-45SH, made by Ajinomoto), for example, is laminated on both surfaces (F1, F2) of core substrate 20 to form interlayer insulation layers (25*a*, 25*b*) as shown in FIG. 7E.

Figure 7F:
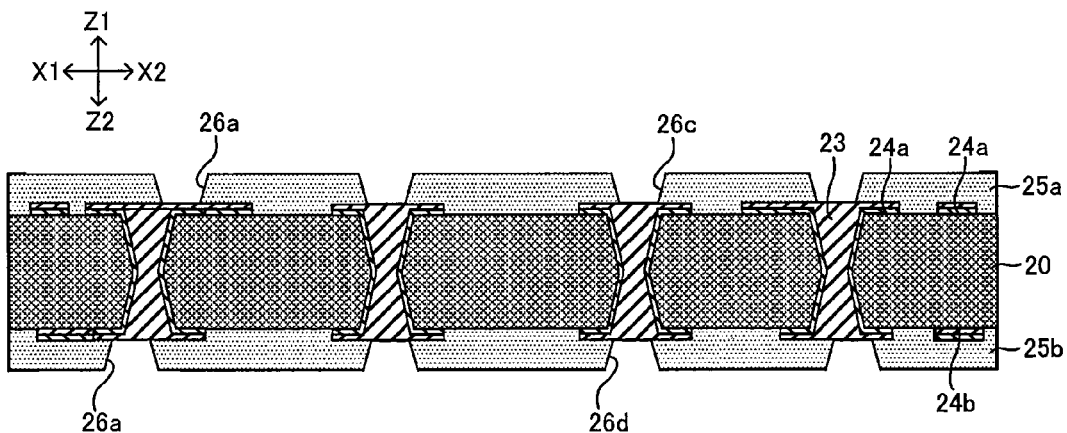
FIG. 7F is a view illustrating a step in the method for manufacturing a wiring board shown in FIG. 6.

As shown in FIG. 7F, using a $CO_2$ gas laser, via-hole opening portions (26*c*, 26*d*) are formed respectively in interlayer insulation layers (25*a*, 25*b*). Moreover, the substrate is immersed in an oxidation agent such as permanganate or the like to perform desmearing treatment.

Figure 7G:
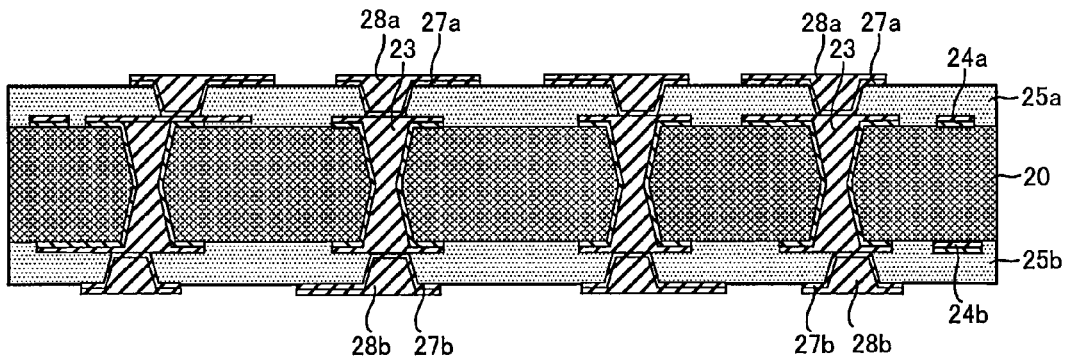
FIG. 7G is a view illustrating a step in the method for manufacturing a wiring board shown in FIG. 6.

Then, as shown in FIG. 7G a catalyst such as palladium is attached to surfaces of interlayer insulation layers (25*a*, 25*b*) and the substrate is immersed in an electroless plating solution. Accordingly, electroless plated films (27*a*, 27*b*) are formed. After that, plating resist (not shown) is formed on electroless plated films (27a, 27b), and electrolytic plated films (28a, 28b) are formed on portions of electroless plated films (27a, 27b) exposed from the plating resist. Then, the plating resist is removed by using a solution containing monoethanolamine. By etching away the electroless plated film between portions of electrolytic plated film, conductive layers (29a, 29b) and via conductors (30a, 30b) are formed. Next, Sn plating is performed on surfaces of conductive layers (29a, 29b) to form SnCu layers. A silane coupling agent is applied on the SnCu layers.

Figure 7H:
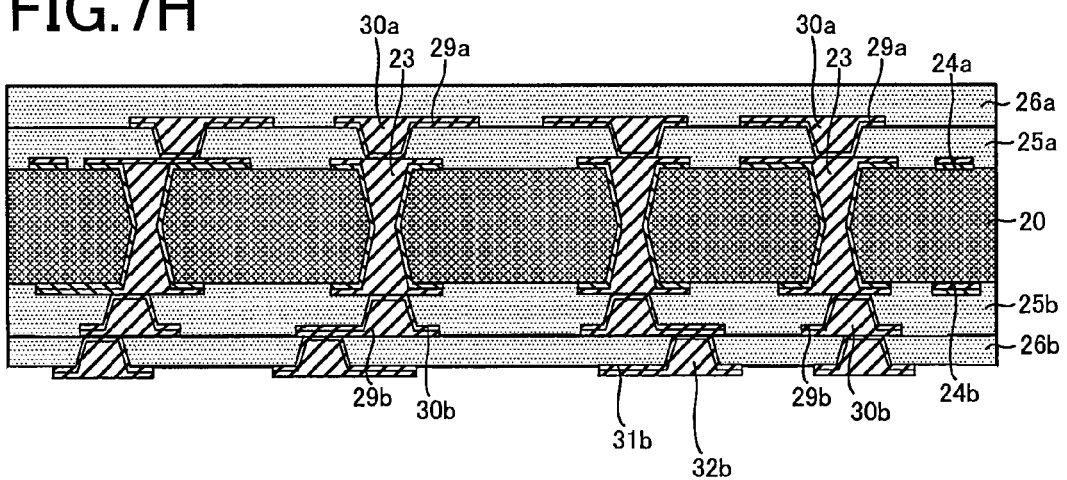
FIG. 7H is a view illustrating a step in the method for manufacturing a wiring board shown in FIG. 6.
Figure 7I:
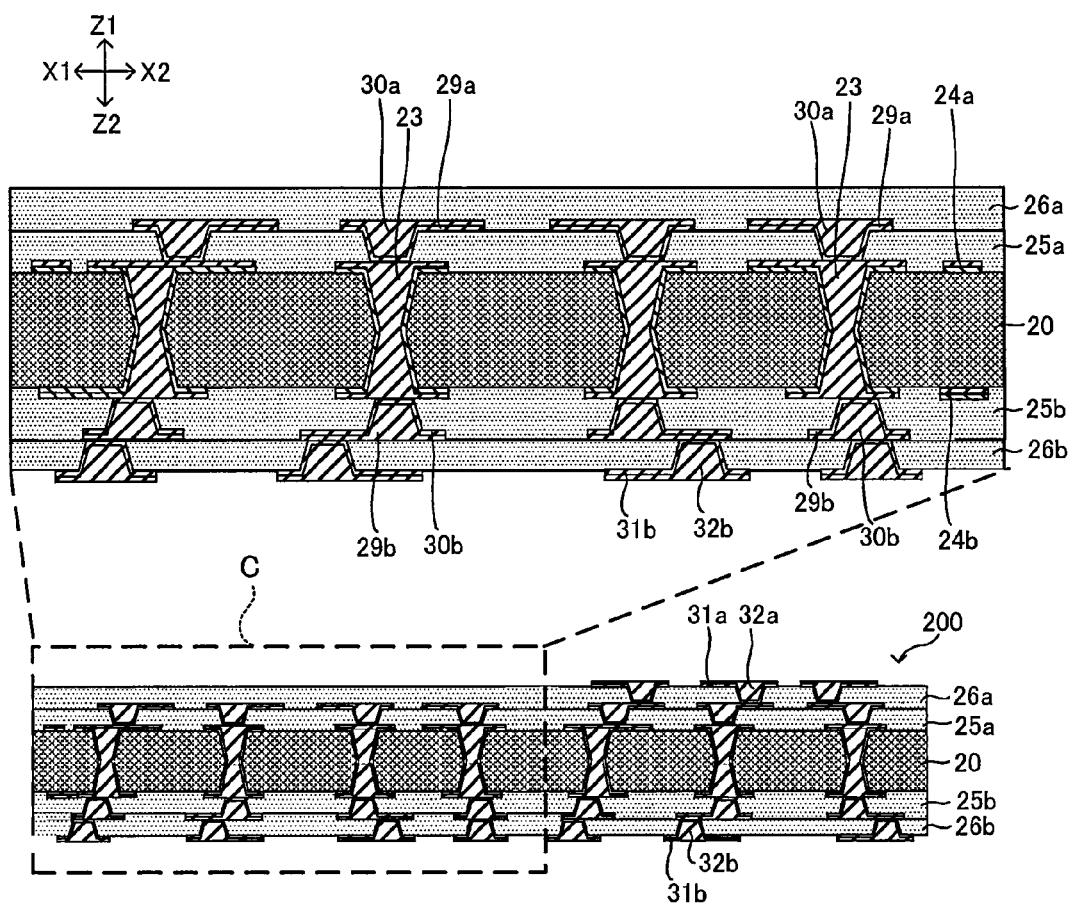
FIG. 7I is a view illustrating a step in the method for manufacturing a wiring board shown in FIG. 6 (the lower view is an enlarged cross section of region "C," which is a part of the upper view)
Figure 7J:
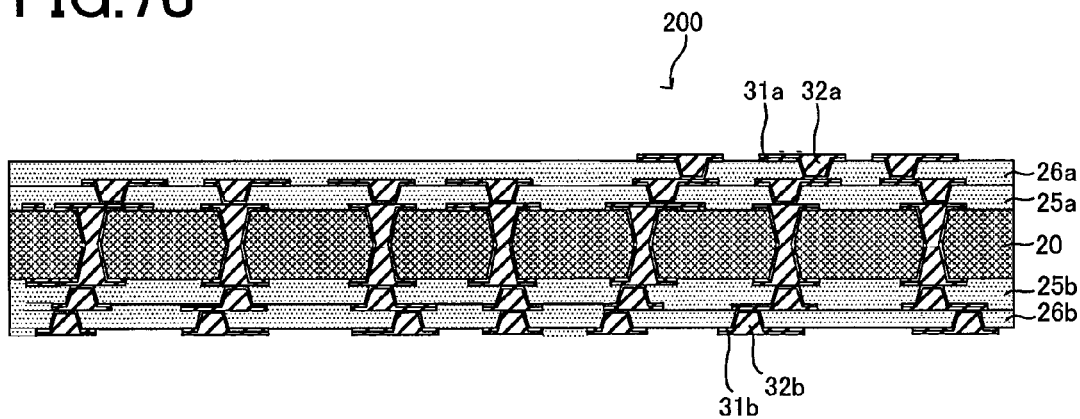
FIG. 7J is a view illustrating a step in the method for manufacturing a wiring board shown in FIG. 6.

Next, in step (S24) of FIG. 6, the steps described above are repeated as shown in FIGS. 7H and 7I. Accordingly, on interlayer insulation layers (25a, 25b), interlayer insulation layers (26a, 26b) are laminated from the first-surface (F1) side and the second-surface (F2) side of core substrate 20, and conductive layers (31a, 31b) and via conductors (32a, 32b) are respectively formed on and in interlayer insulation layers (26a, 26b).

Figure 7K:
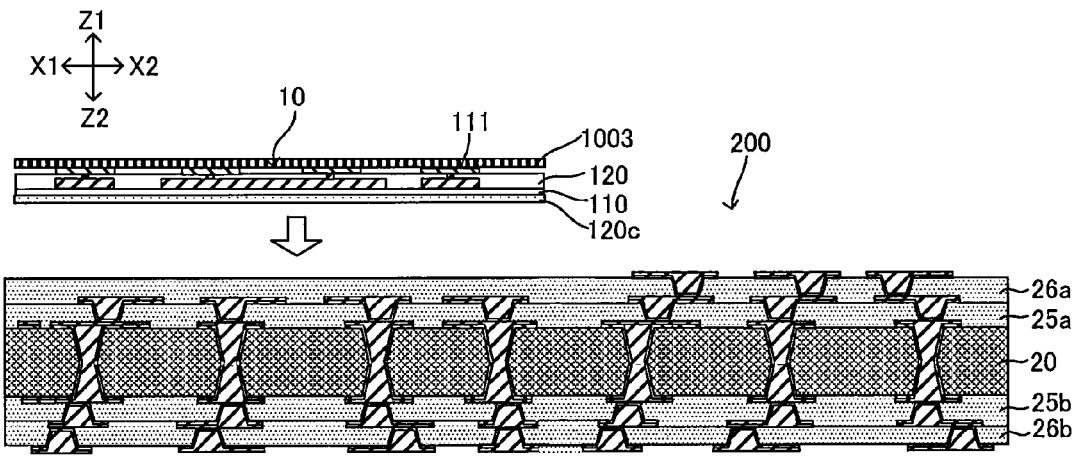
FIG. 7K is a view illustrating a step in the method for manufacturing a wiring board shown in FIG. 6.
Figure 7L:
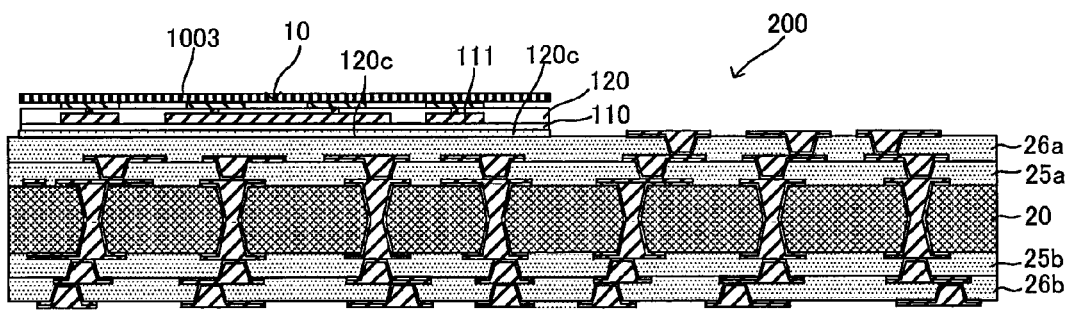
FIG. 7L is a view illustrating a step in the method for manufacturing a wiring board shown in FIG. 6.

In step (S25) of FIG. 6, wiring structure 10 is mounted (laminated) in a predetermined region on interlayer insulation layers (26a) with adhesive layer (120c) disposed in between, as shown in FIG. 7K. Here, in completed wiring board 100 shown in FIGS. 1A and 1C, wiring structure 10 is positioned on main wiring board 200 to be separated from the closest conductive layer (31a) so that distance (L4) (μm) between adjacent conductive pads (36c, 36e) is set longer than distance (L1) (μm) between conductive pads (36c), and distance (L5) (μm) between adjacent conductive pads (36d, 36e) is set longer than distance (L2) (μm) between conductive pads (36d). Here, distance (L4) (μm) between adjacent conductive pads (36c, 36e) is set, for example, twice as long as distance (L1) (μm) between conductive pads (36c). Also, distance (L5) (μm) between adjacent conductive pads (36d, 36e) is set, for example, twice as long as distance (L2) (μm) between conductive pads (36d). Accordingly, the substrate is in a state as shown in FIG. 7L.

Figure 7M:
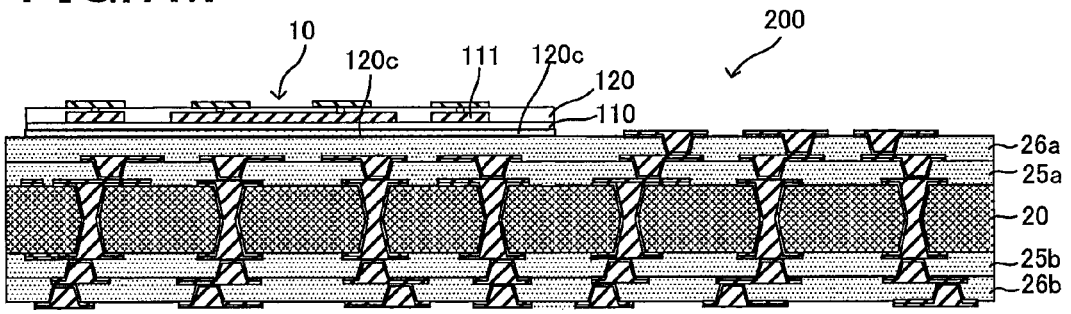
FIG. 7M is a view illustrating a step in the method for manufacturing a wiring board shown in FIG. 6.

Next, support plate 1003 is removed as shown in FIG. 7M.

Figure 7N:
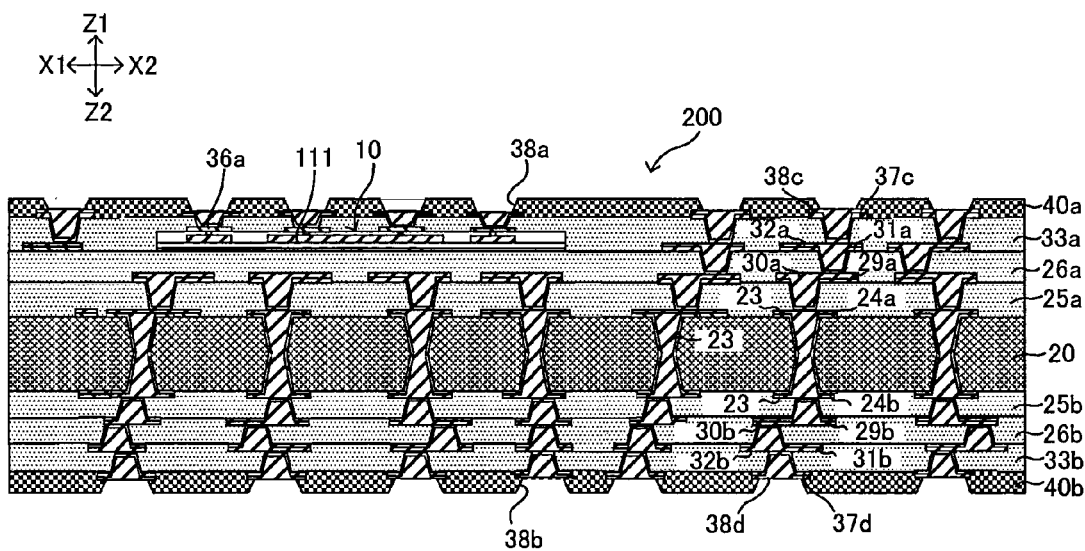
FIG. 7N is a view illustrating a step in the method for manufacturing a wiring board shown in FIG. 6.

Then, in step (S26) of FIG. 6, the above-described steps are repeated as shown in FIG. 7N. Accordingly, on interlayer insulation layers (26a, 26b), interlayer insulation layers (33a, 33b) are laminated from the first-surface (F1) side and the second-surface (F2) side of core substrate 20 (wiring board 100), and conductive layer (37c) (conductive pads (36c, 36d, 36e)), conductive layer (37d) and via conductors (38c, 38d) are respectively formed on and in interlayer insulation layers (33a, 33b).

Referring to FIG. 7N, after solder-resist layers (40a, 40b) are formed on both surfaces of the substrate by a conventional method, opening portions (38a, 38b) are respectively formed in solder-resist layers (40a, 40b) by photolithography in step (S27) of FIG. 6. Here, top surfaces of conductive layers (37c, 37d) exposed from opening portions (38a, 38b) work as solder pads.

Figure 7P:
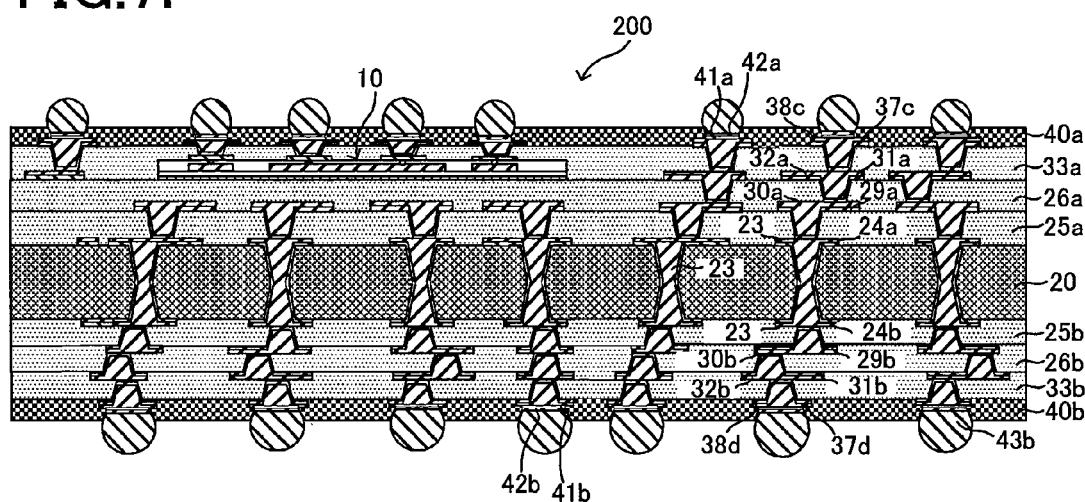
FIG. 7P is a view illustrating a step in the method for manufacturing a wiring board shown in FIG. 6.

As shown in FIG. 7P, nickel-plated layers (41a, 41b) are formed on solder pads, and gold-plated layers (42a, 42b) are further formed on nickel-plated layers (41a, 41b). Instead of nickel-gold layers, nickel-palladium-gold layers may also be formed. After that, solder balls are loaded in opening portions (38a, 38b) and a reflow process is conducted. Accordingly, solder bumps (43a) are formed on the first-surface (upper-surface) side, and solder bumps (43b) are formed on the second-surface (lower-surface) side to complete wiring board 100 (see FIGS. 1A and 1C) as a multilayer printed wiring board.

In the above embodiment, wiring structure 10 was formed in interlayer insulation layer (33a) positioned as the first-surface (F1) side uppermost surface of wiring board 100, but it may also be formed in inner interlayer insulation layers (26a, 25a).

The present embodiment may be modified within a scope that does not deviate from the technological concept of the present invention. In the following, a modified example of the present embodiment is described.

Modified Example

Figure 8:
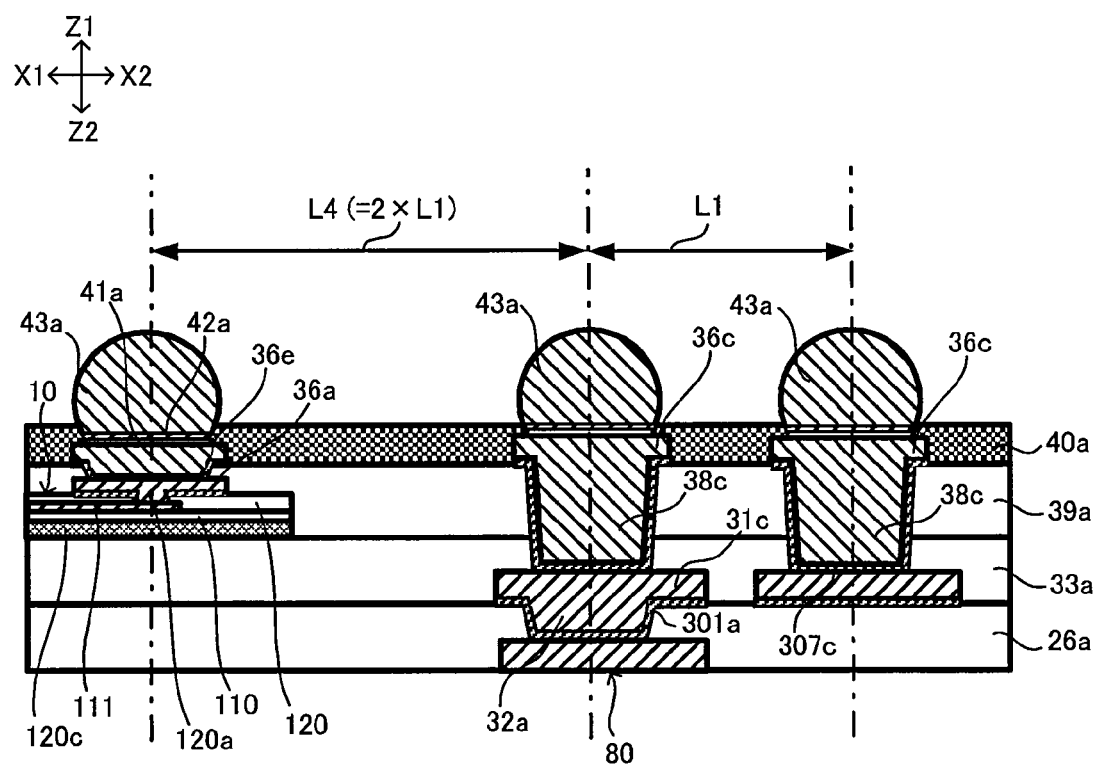
FIG. 8 is a cross-sectional view showing a part of a wiring board according to a modified example of the first embodiment.

In the above embodiment, via conductors (38c) and conductive layer (37c) (conductive pads (36c)), which are connected to DRAM 51 positioned above, were respectively formed in and on interlayer insulation layer (33a) positioned as the uppermost layer (see FIG. 1A). By contrast, in the present modified example, via conductors (38c) and conductive layer (37c) (conductive pads (36c)) are formed extending through different interlayer insulation layers as shown in FIG. 8 (interlayer insulation layers (39a, 33a) in FIG. 8). The rest of the structure and the measurements of each structural element are the same as in the above first embodiment. Also, regarding the process for manufacturing wiring board 100, the same process is employed as for the above embodiment except that via conductors (38c) and conductive layer (37c) are formed to extend through different interlayer insulation layers (39a, 33a).

Second Embodiment

The above first embodiment was set under such conditions that wiring structure 10 was placed in a proper position in wiring board 100 and virtually no positional shifting occurred between wiring structure 10 and wiring board 100.

By contrast, as described below, a second embodiment is set under the conditions that the structure of wiring board 100 is the same as in the first embodiment, but that the position of wiring structure 10 will be shifted when wiring structure 10 is mounted on wiring board 100. Then, after positional shifting has occurred, the positions of conductive pads (36e) to be connected to conductive pads (36a) of wiring structure 10 are set off from conductive pads (36a).

Figure 9A:
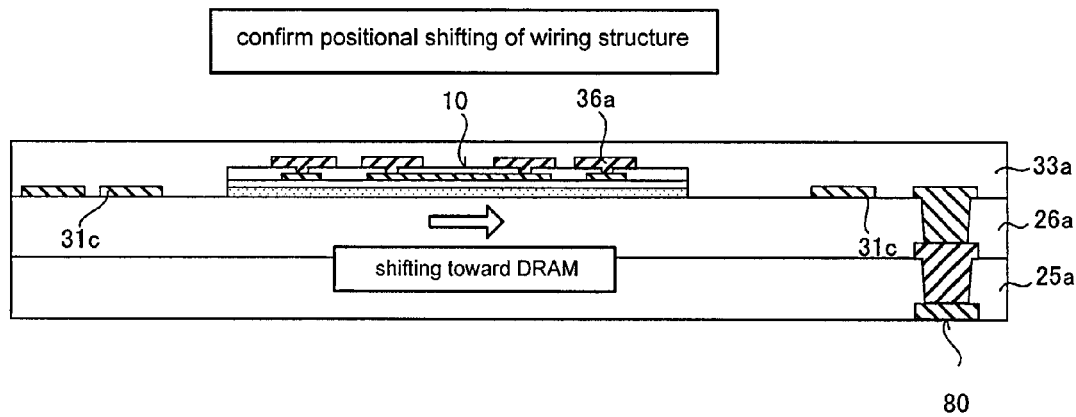
FIG. 9A is a cross-sectional view illustrating a wiring board according to a second embodiment.

In the present embodiment, as shown in FIG. 9A, wiring structure 10 is shifted toward DRAM 51 from the base mounting position shown in FIG. 1B (a) when it is mounted on main wiring board 200.

Figure 9B:
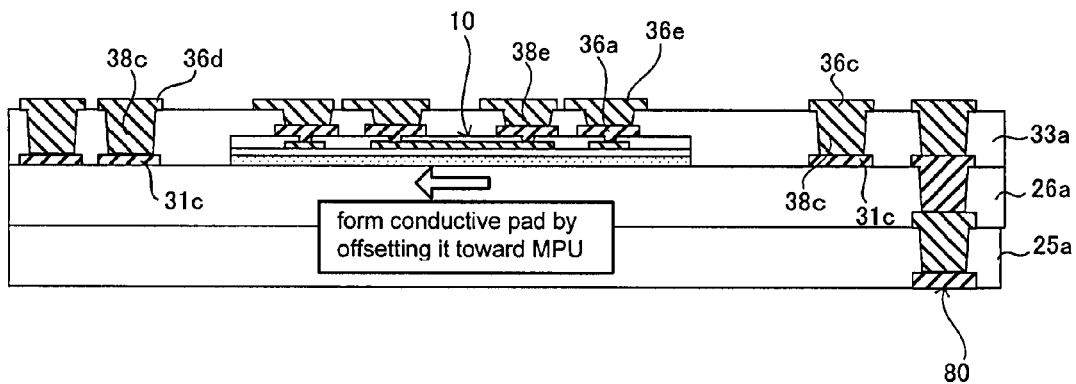
FIG. 9B is another cross-sectional view illustrating the wiring board according to the second embodiment.

In the present embodiment, as shown in FIG. 9B, when conductive pads (36e) are formed on interlayer insulation layer (33a) of wiring board 100 (see FIG. 7N), conductive pads (36e) are formed by being set off from conductive pads (36a) toward MPU 50 based on the amount of positional shifting made by wiring structure 10 toward DRAM 51.

Figure 9C:
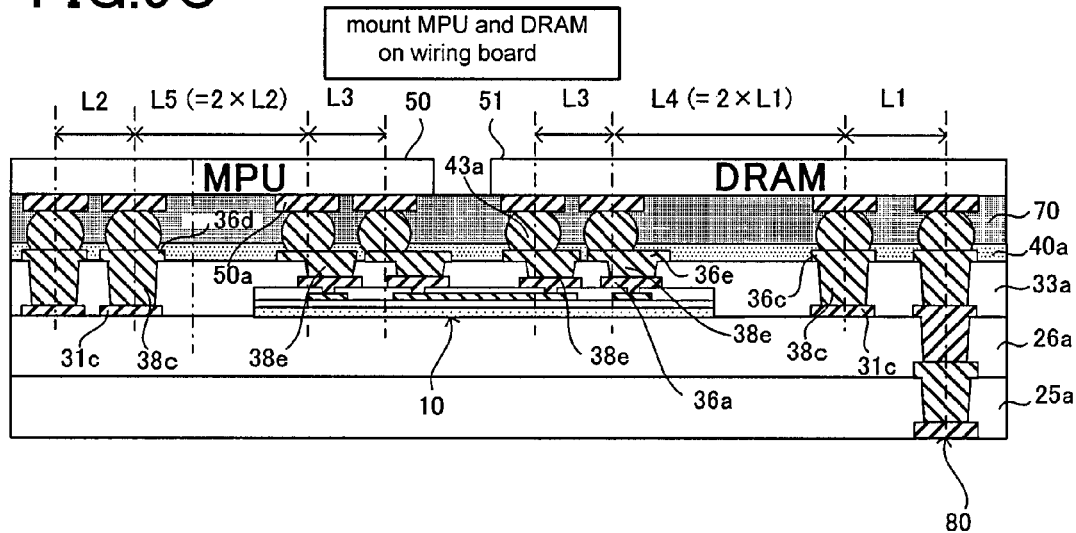
FIG. 9C is yet another cross-sectional view illustrating the wiring board according to the second embodiment.

By so doing, as shown in FIG. 9C, when MPU 50 and DRAM 51 are mounted on wiring board 100, conductive pads (50a) of MPU 50 and conductive pads (51a) of DRAM 51 will be properly connected to conductive pads (36e) of wiring structure 10 through solder bumps (43a).

As described above, even when wiring structure 10 is shifted from the base mounting position, the connection of wiring structure 10 to MPU 50 and DRAM 51 is ensured according to the present embodiment.

In the present embodiment as well, only signal transmission lines are present in wiring structure 10, and no power-supply line is provided. Power is supplied to MPU 50 and DRAM 51 through stacked vias 80 formed in main wiring board 200 as shown in FIG. 1A.

In the present embodiment, since the rest of the structure and functions are the same as in the first embodiment, their detailed descriptions are omitted here by applying the same reference numerals to the corresponding portions. Also, wiring board 100 of the present embodiment is manufactured in the same manner as in the first embodiment except that conductive pads (36e) are formed by being set off toward MPU 50 based on the amount of positional shifting made by wiring structure 10 toward DRAM 51. Thus, the method for manufacturing wiring board 100 is omitted from being described here. In addition, since the method for manufacturing wiring structure 10 is the same as in the first embodiment, its description is omitted.

The embodiments above can be modified within a scope that does not deviate from the technological concept of the present invention. A modified example of the present embodiment is described below.

Modified Example

Figure 10:
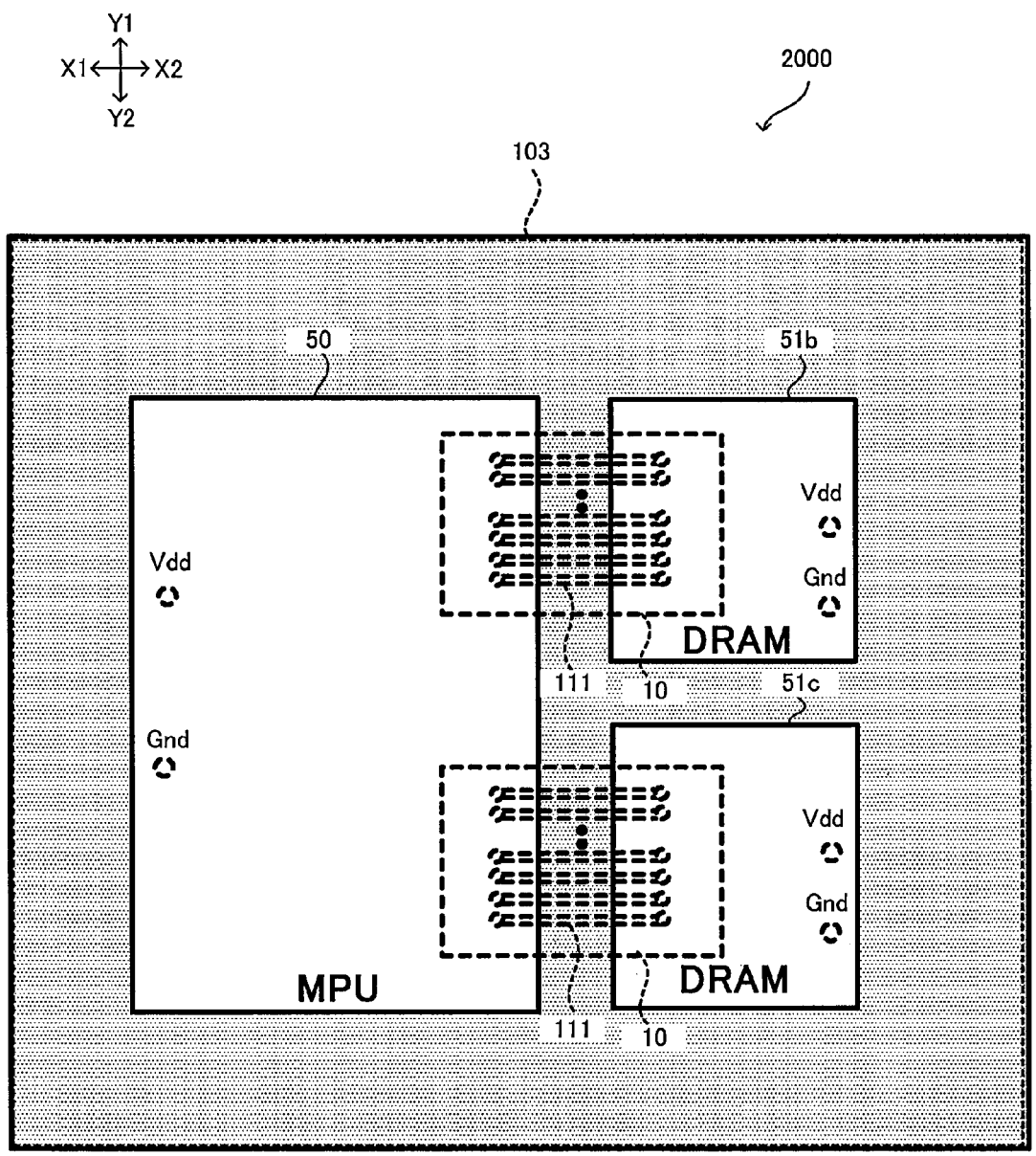
FIG. 10 is a plan view showing a wiring board according to a modified example of embodiments of the present invention.

In the above embodiments, MPU 50 and DRAM 51 were connected by one wiring structure 10. By contrast, in the present modified example, two (multiple) wiring structures 10 are used in wiring board 103 as shown in FIG. 10, and MPU 50 and two DRAMs (51b, 51c) are connected by those wiring structures 10. The rest is the same as the above embodiments, and its detailed description is omitted here by applying the same reference numerals to the corresponding portions.

Compared with an example where only a single wiring structure 10 is used, electrical connection reliability is enhanced between MPU 50 and two DRAMs (51b, 51c) by employing the above-described connection method. Namely, wiring structures 10 exclusively corresponding to the characteristics of DRAMs (51b, 51c) (wiring pitch, wiring width or the like) respectively may be used, for example, thereby enhancing the accuracy of electrical connection. As a result, DRAMs (51b, 51c) connected to MPU 50 can achieve maximum performance.

So far, wiring boards and their manufacturing processes according to embodiments of the present invention have been described. However, a wiring board and its manufacturing process related to the present invention are not limited to the orders and contents shown in each of the above embodiments and modified examples. The orders and contents may be freely modified within a scope that does not deviate from the gist of the present invention. Also, any unnecessary step may be omitted depending on usage purposes or the like.

Any combination is possible for each of the above embodiments and modified examples. An appropriate combination may be selected depending on usage purposes or the like.

As a multilayer printed wiring board for mounting an IC chip (semiconductor element), a wiring board may have an interlayer insulation layer and a conductive layer alternately laminated on a resin core substrate and have through-hole conductors, and the conductive layers may be connected to each other by via-hole conductors.

In recent years, IC chips have become finer and more highly integrated, thus resulting in an increase in the number of mounting pads formed on the uppermost layer of a package substrate. As the number of mounting pads increases, they are formed at a finer pitch. In response to the finer pitch of mounting pads, the wiring pitch of a package substrate is rapidly becoming finer.

High-density wiring may be formed in part of the interior of the wiring board. More specifically, an electronic component with high-density wiring may be provided inside an interlayer insulation layer of the wiring board. Such a structure responds to the above-described finer pitch of mounting pads.

When a thin electronic component is provided in an interlayer insulation layer, positional shifting tends to occur. If an electronic component is provided in a portion shifted from a predetermined position, mounting pads formed on the wiring board (on the package substrate side) may not be properly located in positions corresponding to the terminals of a semiconductor element to be mounted thereon. As a result, mounting a semiconductor element may be difficult.

A wiring board according to an embodiment of the present invention is capable of mounting a semiconductor element at high yield.

A wiring board according to an embodiment of the present invention has the following: a first insulation layer; first conductive patterns which are formed on the first insulation layer and which include first mounting pads for mounting one or more semiconductor elements; a wiring structure which is provided in the first insulation layer and which has a second insulation layer, second conductive patterns formed on the second insulation layer, and second mounting pads connected to the second conductive patterns; and third mounting pads for mounting the semiconductor element which is connected to the second mounting pads and formed further on an upper layer than the second mounting pads.

In such a wiring board, the distance between a first mounting pad and its adjacent third mounting pad is longer than the distance between the first mounting pads.

The distance between the first mounting pad and its adjacent third mounting pad is preferred to be set n-times as long as the distance between the first mounting pads ("n" is a whole number of two or greater).

The distance between the third mounting pads is preferred to be shorter than the distance between the first mounting pads.

The second conductive patterns are preferred to be signal lines to connect a first semiconductor element as one of the semiconductor elements and a second semiconductor element as another one of the semiconductor elements.

The pattern width of the second conductive patterns is characterized by being shorter than the pattern width of the first conductive patterns.

The distance between adjacent second conductive patterns is preferred to be shorter than the distance between adjacent first conductive patterns.

An adhesive layer is preferred to be disposed between the wiring structure and an insulation layer lower than the first insulation layer.

The third mounting pads include first pads connected to a first semiconductor element as one of the semiconductor elements and second pads connected to a second semiconductor element as another one of the semiconductor elements, and the distance between the first pads is preferred to be shorter than the distance between the second pads.

The first semiconductor element is preferred to be a microprocessor and the second semiconductor element is preferred to be a dynamic RAM.

The L/S (line and space) of the second conductive patterns is preferred to be 1 µm/1 µm to 5 µm/5 µm.

The third mounting pads are preferred to be set off from the second mounting pads toward the semiconductor element.

A method for manufacturing a wiring board according to another embodiment of the present invention includes the following: on a first insulation layer, forming first conductive patterns including first mounting pads for mounting a semiconductor element; in the first insulation layer, providing a wiring structure having a second insulation layer, second conductive patterns formed on the second insulation layer, and second mounting pads connected to the second conductive patterns; and forming third mounting pads for mounting the semiconductor element which are connected to the second mounting pads and formed on a further upper layer than the second mounting pads.

In such a manufacturing method, the distance between a first mounting pad and its adjacent third mounting pad is set longer than the distance between the first mounting pads.

It is preferred to further include a step for setting off third mounting pads from the second mounting pads toward the semiconductor element.

A wiring board according to an embodiment of the present invention provides a high reliability.

A wiring board according to an embodiment of the present invention is suitable for use as a package substrate on which multiple semiconductor elements (dies) are to be mounted. Also, a method for manufacturing a wiring board according to an embodiment of the present invention is suitable for manufacturing a package substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising: a first insulation layer;
   a plurality of first conductive patterns formed on the first insulation layer and including a plurality of first mounting pads positioned to mount a semiconductor element;
   a wiring structure positioned in the first insulation layer and comprising a second insulation layer, a plurality of second conductive patterns formed on the second insulation layer, and a plurality of second mounting pads connected to the second conductive patterns; and
   a plurality of third mounting pads formed on the first insulation layer above the second mounting pads and connected to the second mounting pads such that the plurality of third mounting pads is positioned to mount the semiconductor element and forms a distance L4 between adjacent first and third mounting pads which is greater than a distance L1 between adjacent first mounting pads or a distance L5 between adjacent first and third mounting pads which is greater than a distance L2 between adjacent first mounting pads, wherein the plurality of third mounting pads is positioned such that the third mounting pads are horizontally shifted in a same direction from the plurality of second mounting pads toward the semiconductor element.

2. A wiring board according to claim 1, wherein the distance L4 between the adjacent first and third mounting pads is set n-times as great as the distance L1 between the adjacent first mounting pads where n is a whole number of two or greater, or the distance L5 between the adjacent first and third mounting pads is set n-times as great as the distance L2 between the adjacent first mounting pads where n is a whole number of two or greater.

3. A wiring board according to claim 1, wherein the plurality of third mounting pads is formed such that a distance L3 between adjacent third mounting pads is smaller than the distance L1 between the adjacent first mounting pads or the distance L2 between the adjacent first mounting pads.

4. A wiring board according to claim 1, wherein the plurality of second conductive patterns forms a plurality of signal lines which connects the semiconductor element and a second semiconductor element.

5. A wiring board according to claim 1, wherein the plurality of second conductive patterns has a pattern width which is smaller than a pattern width of the plurality of first conductive patterns.

6. A wiring board according to claim 1, wherein the plurality of second conductive patterns forms a distance between adjacent second conductive patterns which is smaller than a distance between adjacent first conductive patterns of the plurality of first conductive patterns.

7. A wiring board according to claim 1, further comprising:
   a lower insulation layer; and
   an adhesive layer formed between the wiring structure and the lower insulation layer,
   wherein the wiring structure and the first insulation layer are formed on the lower insulation layer.

8. A wiring board according to claim 1, wherein the plurality of third mounting pads includes a plurality of first pads positioned to connect to the semiconductor element and a plurality of second pads positioned to connect to a second semiconductor element, and the plurality of first pads has a distance between adjacent first pads which is smaller than a distance between adjacent second pads of the plurality of second pads.

9. A wiring board according to claim 8, wherein the semiconductor element is a microprocessor, and the second semiconductor element is a dynamic RAM.

10. A wiring board according to claim 1, wherein the plurality of second conductive patterns has a line and space, L/S, in a range of 1 µm/1 µm to 5 µm/5 µm.

11. A wiring board according to claim 1, wherein the first insulation layer is a resin insulation layer, and the second insulation layer is a resin insulation layer.

12. A wiring board according to claim 2, wherein the plurality of third mounting pads is formed such that a distance L3 between adjacent third mounting pads is smaller than the distance L1 between the adjacent first mounting pads or the distance L2 between the adjacent first mounting pads.

13. A wiring board according to claim 3, wherein the plurality of second conductive patterns has a pattern width which is smaller than a pattern width of the plurality of first conductive patterns.

14. A wiring board according to claim 3, wherein the plurality of second conductive patterns forms a distance between adjacent second conductive patterns which is smaller than a distance between adjacent first conductive patterns of the plurality of first conductive patterns.

15. A method for manufacturing a wiring board, comprising:
   forming a wiring structure comprising a second insulation layer, a plurality of second conductive patterns formed on the second insulation layer, and a plurality of second mounting pads connected to the second conductive patterns;
   accommodating the wiring structure in a first insulation layer such that the wiring structure is positioned in the first insulation layer;
   forming on the first insulation layer a plurality of first conductive patterns including a plurality of first mounting pads such that the plurality of first mounting pads is positioned to mount a semiconductor element; and
   forming a plurality of third mounting pads on the first insulation layer above the second mounting pads such that the plurality of third mounting pads is connected to the second mounting pads, is positioned to mount the semiconductor element and forms a distance L4 between adjacent first and third mounting pads which is greater than a distance L1 between adjacent first mounting pads or a distance L5 between adjacent first and third mounting pads which is greater than a distance L2 between adjacent first mounting pads, wherein the forming of the third mounting pads includes forming the plurality of third mounting pads such that the third mounting pads are horizontally shifted in a same direction from the second mounting pads toward the semiconductor element.

16. A method for manufacturing a wiring board according to claim 15, wherein the accommodating of the wiring structure includes positioning the wiring structure on a lower insulation layer and laminating the first insulation layer on the lower insulation layer such that the wiring structure on the lower insulation layer is accommodated in the first insulation layer.

17. A method for manufacturing a wiring board according to claim 15, wherein the plurality of third mounting pads is formed such that a distance L3 between adjacent third mounting pads is smaller than the distance L1 between the adjacent first mounting pads or the distance L2 between the adjacent first mounting pads.

18. A method for manufacturing a wiring board according to claim 15, wherein the forming of the third mounting pads includes setting the distance L4 between the adjacent first and third mounting pads to be n-times as great as the distance L1 between the adjacent first mounting pads where n is a whole number of two or greater, or setting the distance L5 between the adjacent first and third mounting pads to be n-times as great as the distance L2 between the adjacent first mounting pads where n is a whole number of two or greater.

19. A wiring board according to claim 2, wherein the plurality of second conductive patterns forms a plurality of signal lines which connects the semiconductor element and a second semiconductor element.

20. A wiring board according to claim 3, wherein the plurality of second conductive patterns forms a plurality of signal lines which connects the semiconductor element and a second semiconductor element.

* * * * *